US012793780B2

(12) United States Patent
Baek et al.

(10) Patent No.: US 12,793,780 B2
(45) Date of Patent: Nov. 10, 2026

(54) MEMORY DEVICE FOR PROGRAM DISTURBANCE SUPPRESSION AND PROGRAMMING METHOD THEREOF

(71) Applicant: SAMSUNG ELECTRONICS CO., LTD., Suwon-si (KR)

(72) Inventors: Rockhyun Baek, Pohang-si (KR); Kihoon Nam, Pohang-si (KR)

(73) Assignees: SAMSUNG ELECTRONICS CO., LTD., Suwon-si (KR); POSTECH Research and Business Development Foundation, Pohang-si (KR)

( * ) Notice: Subject to any disclaimer, the term of this patent is extended or adjusted under 35 U.S.C. 154(b) by 109 days.

(21) Appl. No.: 18/814,030

(22) Filed: Aug. 23, 2024

(65) Prior Publication Data

US 2025/0069668 A1 Feb. 27, 2025

(30) Foreign Application Priority Data

Aug. 24, 2023 (KR) ........................ 10-2023-0111519
Dec. 11, 2023 (KR) ........................ 10-2023-0178740

(51) Int. Cl.
*G11C 16/10* (2006.01)
*G11C 16/04* (2006.01)
*G11C 16/08* (2006.01)
*G11C 16/12* (2006.01)
*G11C 16/24* (2006.01)

(52) U.S. Cl.
CPC .......... *G11C 16/10* (2013.01); *G11C 16/0483* (2013.01); *G11C 16/08* (2013.01); *G11C 16/12* (2013.01); *G11C 16/24* (2013.01)

(58) Field of Classification Search
CPC ..... G11C 16/10; G11C 16/0483; G11C 16/08; G11C 16/12; G11C 16/24; G11C 11/5628; G11C 16/30; G11C 16/3459; G11C 16/32; G11C 16/3418
See application file for complete search history.

(56) References Cited

U.S. PATENT DOCUMENTS 8,427,881 B2 4/2013 Jang et al.
9,508,441 B1 * 11/2016 Nam .................. G11C 16/0483
9,595,333 B2 3/2017 Sim et al.
10,614,891 B2 4/2020 Park et al.
10,726,920 B2 7/2020 Yang
(Continued)

*Primary Examiner* — Jay W. Radke
(74) *Attorney, Agent, or Firm* — Sughrue Mion, PLLC

(57) ABSTRACT

A memory device, including: a memory cell array including a plurality of cell strings; a voltage generator configured to generate a precharge voltage, a program voltage, and a negative voltage; and a control logic circuit configured to control a program operation for programming a threshold voltage of a selected memory cell to have a target state, wherein the program operation is performed using a plurality of program loops, based on a voltage increment of the program voltage, and wherein each program loop from among the plurality of program loops includes a precharge duration and a program execution duration, wherein the control logic circuit is further configured to provide the negative voltage to a plurality of unselected string select transistors and a plurality of unselected ground select transistors included in a plurality of unselected cell strings from among the plurality of cell strings, during the program execution duration.

19 Claims, 18 Drawing Sheets

(56) References Cited

U.S. PATENT DOCUMENTS

| | | | | |
|---|---|---|---|---|
| 10,998,049 | B1 | 5/2021 | Wei et al. | |
| 11,081,179 | B2 | 8/2021 | Yang | |
| 11,527,293 | B2 | 12/2022 | Park et al. | |
| 2023/0015493 | A1 | 1/2023 | Jung et al. | |
| 2023/0112849 | A1 * | 4/2023 | Kim | G11C 16/10 365/185.03 |
| 2023/0253044 | A1 * | 8/2023 | Cho | H10B 41/27 257/314 |
| 2024/0161834 | A1 * | 5/2024 | Heo | G11C 16/24 |

* cited by examiner

| BPNB scheme bias | | |
|---|---|---|
| Memory Cell | BL | SSL |
| Target | VPRE → VSS | VSSL |
| Y | VPRE → VSS | VPRE → VNEG |
| XY | VBL | VPRE → VNEG |
| X | VBL | VSSL |

MEMORY DEVICE FOR PROGRAM DISTURBANCE SUPPRESSION AND PROGRAMMING METHOD THEREOF

CROSS-REFERENCE TO RELATED APPLICATION

This application is based on and claims priority under 35 U.S.C. § 119 to Korean Patent Application Nos. 10-2023-0111519, filed on Aug. 24, 2023 and 10-2023-0178740, filed on Dec. 11, 2023, in the Korean Intellectual Property Office, the disclosures of which are incorporated by reference herein in their entireties.

BACKGROUND

1. Field

The disclosure relates to semiconductor memory devices, and more particularly, to memory devices for program disturbance suppression and programming methods thereof.

2. Description of Related Art

To store data or instructions used by a host and/or perform a computational operation, a system using semiconductor chips may use a dynamic random access memory (DRAM) as an operation memory or main memory of the system and uses storage devices as storage media. The storage devices may include a non-volatile memory. As the capacity of the storage devices increases, the number of memory cells and word lines stacked on a substrate of the non-volatile memory increases and the number of data bits stored in the memory cells also increases. To improve the storage capacity and integration degree of a memory, non-volatile memory devices in which memory cells are stacked in a three-dimensional (3D) structure, for example, 3D NAND flash memory devices, may be used.

In a 3D NAND flash memory device, a plurality of program loops can be performed until a program is completed according to incremental step pulse programming (ISPP). As the program loop increases, a program voltage may be applied as a series of pulses to a memory cell and the magnitude of the program pulses increases by a predetermined step size. Verification operations (or verification read operations) may be performed in durations between the program pulses. For example, verification operations may be performed on a data state of a memory cell in order to determine whether the memory cell has been programmed to a target level.

To increase a capacity per unit area, one or more bits may be programmed to a memory cell. The memory cell may be classified into a single-level cell (SLC), a multi-level cell (MLC), a triple-level cell (TLC), or a quad-level cell (QLC) based on the number of bits which may be stored in the memory cell. The memory cell may have a plurality of program states depending on the number of bits stored in the memory cell. The plurality of program states can be defined as a range of a threshold voltage (which may be denoted Vth). As multi-level cells (e.g., 4-state MLC, 8-state MLC, and 16-state MLC) are employed, the program time may gradually increase.

In addition, an ideal data state of programmed multi-level cells should be able to maintain a certain voltage gap from an adjacent data state and secure a sufficient read margin. However, during a program operation of the multi-level cells, a high voltage repeatedly applied to a selected memory cell or an adjacent memory cell may have an influence such as coupling, resulting in a program disturbance phenomenon. Due to this, a threshold voltage of each data state of the multi-level cells may be deformed into a non-ideal or otherwise undesirable form. Accordingly, there is a need for a method of suppressing the program disturbance phenomenon and improving a program characteristic.

SUMMARY

Provided are memory devices that perform programming methods for program disturbance suppression.

Additional aspects will be set forth in part in the description which follows and, in part, will be apparent from the description, or may be learned by practice of the presented embodiments.

In accordance with an aspect of the disclosure, a memory device includes: a memory cell array including a plurality of cell strings, wherein each cell string includes a plurality of memory cells which are coupled in series between a string select transistor and a ground select transistor; a voltage generator configured to generate a precharge voltage, a program voltage, and a negative voltage, wherein a voltage level of the precharge voltage is higher than a voltage level of a ground voltage, and a voltage level of the negative voltage is lower than the voltage level of the ground voltage; and a control logic circuit configured to control a program operation for programming a threshold voltage of a selected memory cell of a selected cell string from among the plurality of cell strings to have a target state, wherein the program operation is performed using a plurality of program loops, based on a voltage increment of the program voltage, and wherein each program loop from among the plurality of program loops includes a precharge duration and a program execution duration, wherein the control logic circuit is further configured to provide the negative voltage to a plurality of unselected string select transistors and a plurality of unselected ground select transistors included in a plurality of unselected cell strings from among the plurality of cell strings, during the program execution duration.

In accordance with an aspect of the disclosure, a programming method for programming a memory device including a plurality of cell strings, each of which includes a plurality of memory cells coupled in series between a string select transistor and a ground select transistor, includes: generating a precharge voltage, a program voltage, a pass voltage, and a negative voltage, wherein a voltage level of the precharge voltage is higher than voltage level of a ground voltage, and a voltage level of the negative voltage is lower than a voltage level of the ground voltage, and wherein a voltage level of the pass voltage is set to a voltage level configured to active the plurality of memory cells regardless of program states of the plurality of memory cells; performing a program operation for programming a threshold voltage of a selected memory cell of a selected cell string from among the plurality of cell strings to have a target state, wherein the program operation is performed using a plurality of program loops, based on a voltage increment of the program voltage, and wherein each program loop of the plurality of program loops includes a precharge duration and a program execution duration; providing the precharge voltage to a plurality of unselected string select transistors and a plurality of unselected ground select transistor included in a plurality of unselected cell strings from among the plurality of cell strings, during the precharge duration; and providing the negative voltage to the plurality of unselected string select transistors and the plurality of unselected ground select transistors, during the program execution duration.

In accordance with an aspect of the disclosure, a programming method of a memory device including a plurality of cell strings, each of which includes a plurality of memory cells are coupled in series between a string select transistor and a ground select transistor, includes: generating a precharge voltage, a program voltage, and a negative voltage, wherein a voltage level of the precharge voltage is higher than a voltage level of a ground voltage, and a voltage level of the negative voltage is lower than the voltage level of the ground voltage; performing a program operation for programming a threshold voltage of a selected memory cell of a selected cell string from among the plurality of cell strings to have a target state, wherein the program operation is performed using program loops, based on a voltage increment of the program voltage, and wherein each program of the plurality of program loops includes a precharge duration and a program execution duration; providing the ground voltage to a plurality of unselected string select transistors and a plurality of unselected ground select transistors included in unselected cell strings from among the plurality of cell strings, during the precharge duration; and providing the negative voltage to the plurality of unselected string select transistors and the plurality of unselected ground select transistors, during the program execution duration.

BRIEF DESCRIPTION OF DRAWINGS

The above and other aspects, features, and advantages of certain embodiments of the present disclosure will be more apparent from the following detailed description taken in conjunction with the accompanying drawings in which.

DETAILED DESCRIPTION

Figure 1:
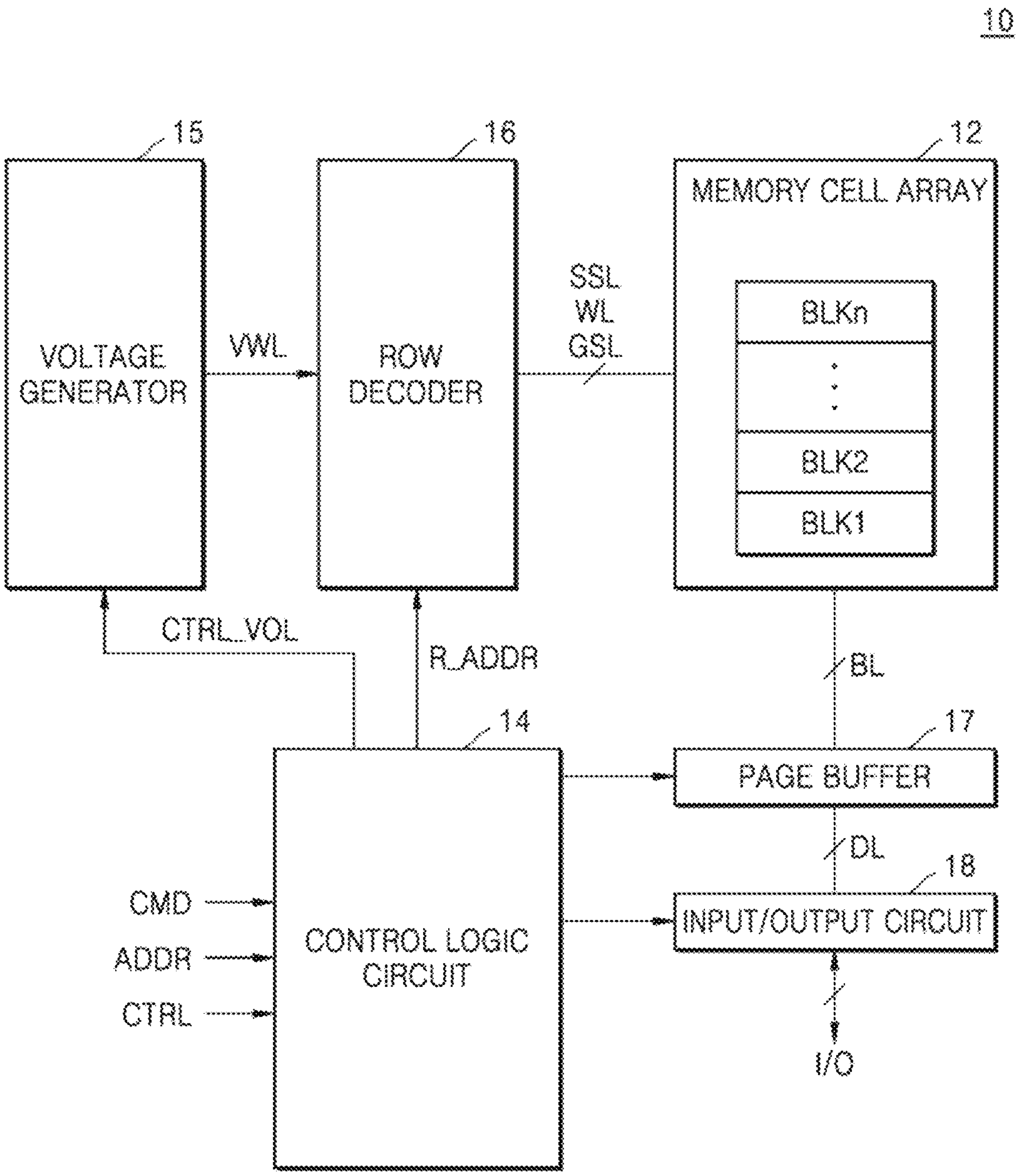
FIG. 1 is a block diagram conceptually illustrating a memory device according to embodiments.

Hereinafter, embodiments will be described with reference to the accompanying drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

Figure 2:
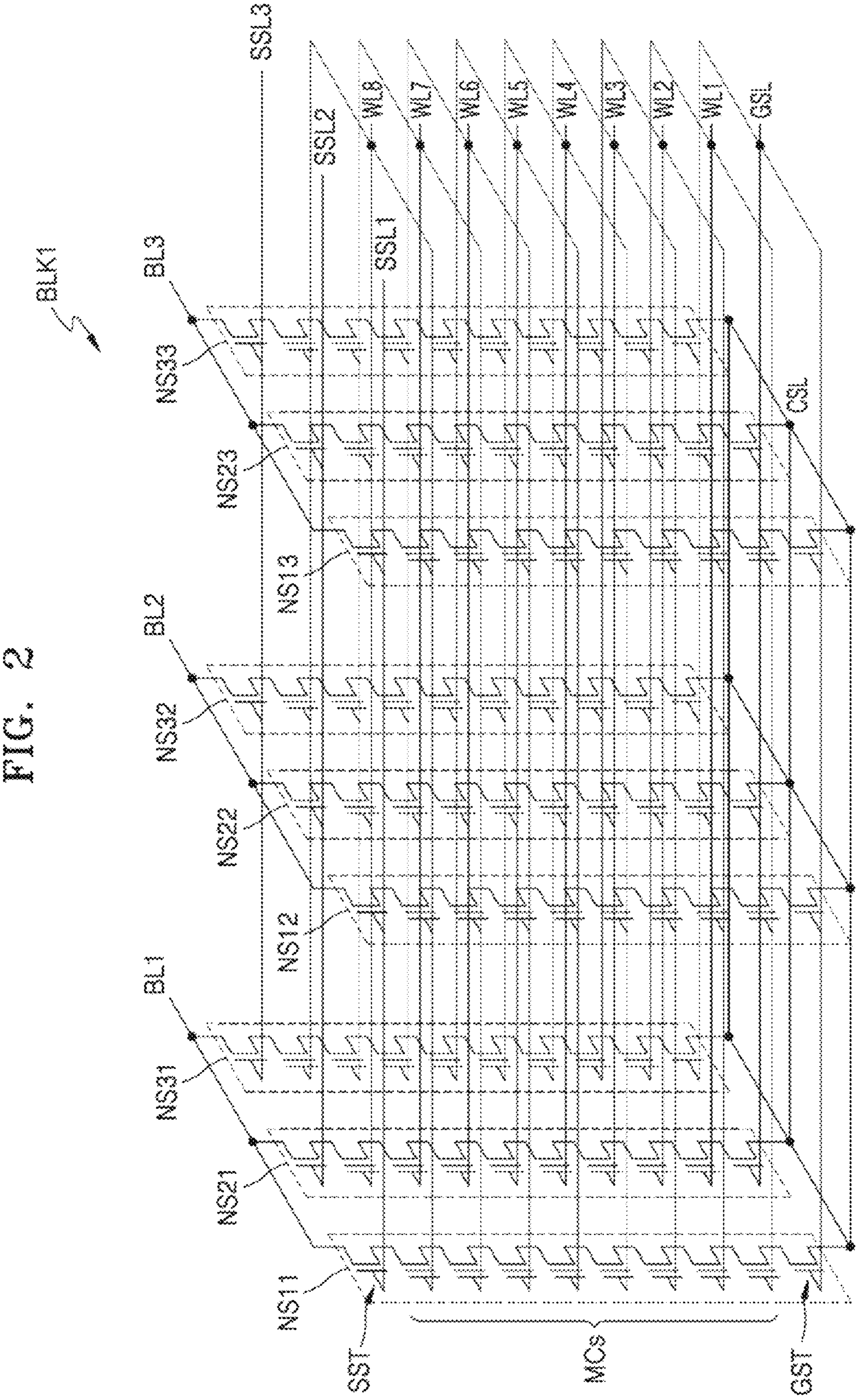
FIG. 2 illustrates an equivalent circuit diagram of a memory block of FIG. 1.

FIG. 1 is a block diagram conceptually illustrating a memory device according to embodiments. FIG. 2 illustrates an equivalent circuit diagram for a memory block of FIG. 1.

Referring to FIG. 1, a memory device 10 may include a memory cell array 12, a control logic circuit 14, a voltage generator 15, a row decoder 16, a page buffer 17, and an input/output circuit 18. In some embodiments, the memory device 10 may further include an input/output interface coupled to a memory controller that is an external device.

The memory cell array 12 may be coupled to word lines WL, string select lines SSL, ground select lines GSL, and bit lines BL. The memory cell array 12 may be coupled to the row decoder 16 through the word lines WL, the string select lines SSL, and the ground select lines GSL and may be coupled to the page buffer 17 through the bit lines BL. The memory cell array 12 may include a plurality of memory blocks BLK1 to BLKn, where n is a natural number of 2 or more. Each memory block of the plurality of memory blocks BLK1 to BLKn may include a plurality of memory cells. For example, the plurality of memory cells may include flash memory cells. Hereinafter, embodiments are described in detail by way of an example in which each memory cell of the plurality of memory cells BLK1 to BLKn include NAND flash memory cells, but embodiments are not limited thereto. The memory cell array 12 may include a three-dimensional memory cell array including a plurality of cell strings.

The three-dimensional memory cell array may be formed in a monolithic manner in a physical level of at least one memory cell array that has an active region disposed on a silicon substrate and a circuit formed on or in the substrate as a circuit related to an operation of memory cells. The term "monolithic" may mean that layers of each level included in the array may be stacked directly on layers of each lower level of the array. In an embodiment, the three-dimensional memory cell array may include cell strings arranged in a vertical direction such that at least one memory cell is located above another memory cell. The at least one memory cell may include a charge trap layer. U.S. Pat. Nos. 7,679,133, 8,553,466, 8,654,587, 8,559,235, and U.S. Patent Application Publication No. 2011/0233648, the disclosures of which are incorporated by reference herein in their entirety, disclose suitable configurations of a three-dimensional memory array including a plurality of levels and sharing word lines and/or bit lines between the levels.

Each memory block BLK1 to BLKn may include a plurality of memory cells and a plurality of select transistors (e.g., string select transistors SST and ground select transistors GST). The memory cells may be respectively coupled to the word lines WL, and the select transistors may be coupled to the string select lines SSL or the ground select lines GSL. The memory cells included each memory block BLK1 to BLKn may include single-level cells storing 1-bit data, or may include multi-level cells storing M-bit data, where M is an integer of 2 or more.

The row decoder 16 may select one of the plurality of memory blocks BLK1 to BLKn of the memory cell array 12, may select one of the word lines WL of the selected memory block, and may select one of the plurality of string select lines SSL.

The control logic circuit 14 may output various internal control signals for performing program, read, and erase operations on the memory cell array 12, based on a command CMD, an address ADDR, and a control signal CTRL received from the memory controller. The control logic circuit 14 may provide a row address R_ADDR to the row decoder 16, may provide a column address to the input/output circuit 18, and may provide a voltage control signal CTRL_VOL to the voltage generator 15.

The control logic circuit 14 may control a program operation such that threshold voltages of memory cells of a first page and a second page disposed adjacently to each other at the same height from a substrate within the memory cell array 12 have a plurality of target states. In some embodiments, the first page may be referred to as a previous page, and the second page may be referred to as a next page, and the previous page and the next page may be disposed adjacently to each other at the same height from a substrate within the memory cell array 12.

In some embodiments, the control logic circuit 14 may boost a channel potential using a self-boosting effect to prevent program disturbance from occurring in a channel of a program-inhibited cell string during a program operation. The self-boosting effect may refer to precharging a program-inhibited channel in the bit line BL and causing the program-inhibited channel to be a floating node, and coupling a series capacitance from the word line WL to the channel, in order to automatically boost the channel potential.

In some embodiments, the control logic circuit 14 may perform a program operation using a bidirectional precharge and negative bias (BPNB) scheme which includes precharging the program-inhibited channel not only in the bit line BL but also a common source line CSL, and causing the program-inhibited channel to have an enhanced self-boosting effect. The BPNB scheme may suppress program disturbance by sufficiently depleting electrons remaining in the program-inhibited channel and allowing the program-inhibited channel to have a high channel potential, before a program voltage of a program execution duration is applied to the word line WL for a program execution duration.

In some embodiments, the control logic circuit 14 may provide a negative (−) voltage to a string select transistor and a ground select transistor coupled to a program-inhibited channel, during a program execution duration. This may be done to prevent the introduction of electrons from the bit line and the common source line and consistently keep the channel potential high.

The page buffer 17 may operate as a write driver or a sense amplifier depending on an operation mode. During a read operation, the page buffer 17 may sense a bit line BL of a selected memory cell under the control by the control logic circuit 14. Sensed data may be stored in latches provided within the page buffer 17. The page buffer 17 may dump the data stored in the latches to the input/output circuit 18 through a data line DL under the control by the control logic circuit 14.

The input/output circuit 18 may temporarily store a command CMD, an address ADDR, and data DATA that are provided through an input/output line I/O from the memory controller. The input/output circuit 18 may temporarily store read data of the memory device 10 and output the stored data to an outside (e.g., an outside of the memory device 10) through the input/output line I/O at a specified time.

Figure 8:
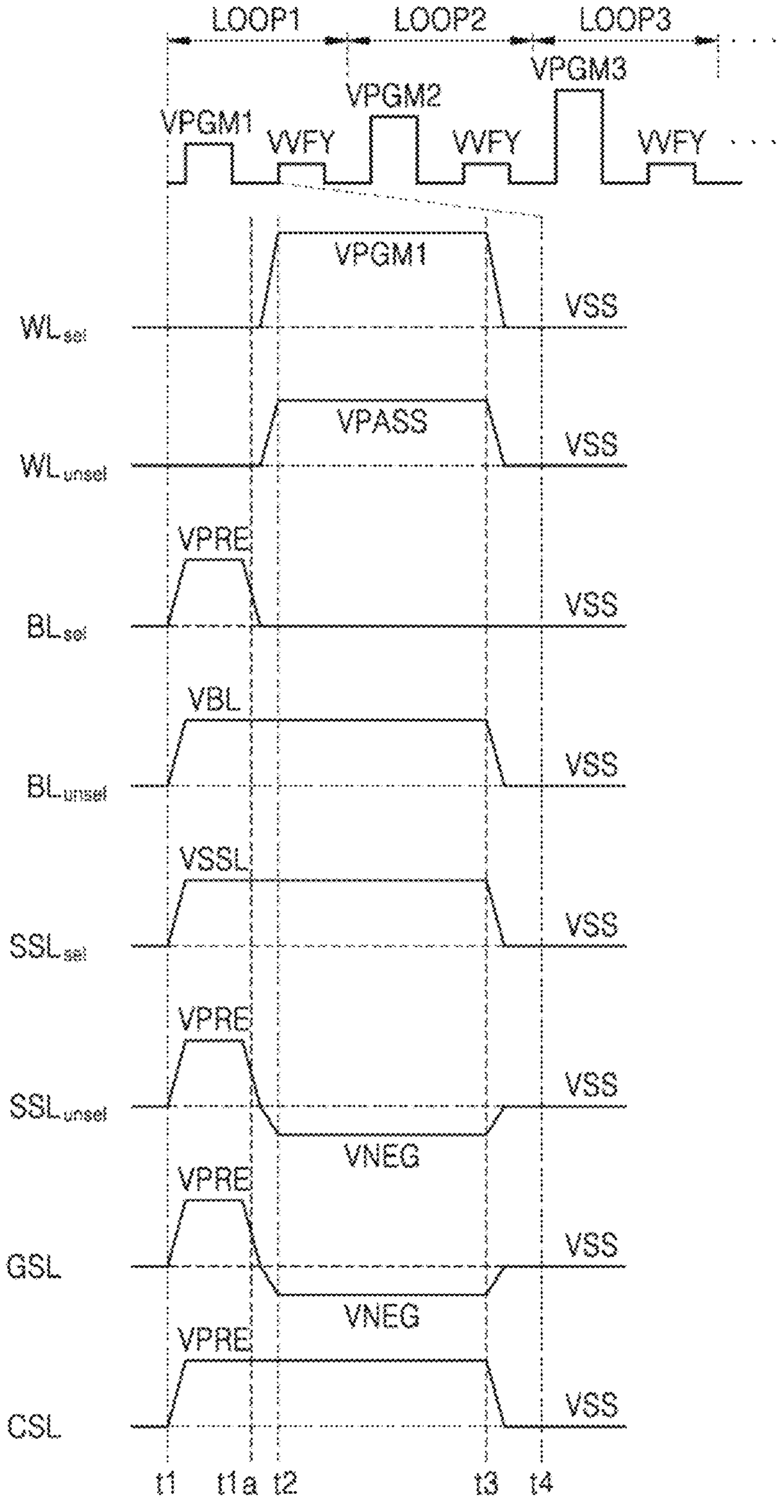
FIGS. 8 and 9 are diagrams illustrating a programming process according to embodiments.

The voltage generator 15 may generate various types of voltages VWL for performing program, read, and erase operations on the memory cell array 12, based on a voltage control signal CTRL_VOL. For example, as shown in FIG. 8, the voltage generator 15 may generate a program voltage VPGM, a verification voltage VVFY, a read voltage, a pass voltage VPASS, an erase voltage, an erase verification voltage, a precharge voltage VPRE, a negative (−) voltage VNEG, etc.

The memory block BLK1 shown in FIG. 2 is an example of the plurality of memory blocks BLK1 to BLKn described with reference to FIG. 1. Hereinafter, embodiments are described in detail by way of an example of the first memory block BLK1. The first memory block BLK1 may represent a three-dimensional memory block that is formed in a three-dimensional structure on a substrate. A plurality of memory cell strings included in the first memory block BLK1 may be formed in a direction perpendicular to the substrate.

Referring to FIG. 2, the first memory block BLK1 may include NAND strings NS11 to NS33, word lines WL1 to WL8, bit lines BL1 to BL3, a ground select line GSL, string select lines SSL1 to SSL3, and a common source line CSL. In FIG. 2, each of the cell strings NS11 to NS33 is shown as including eight memory cells MC coupled to eight word lines WL1 to WL8, but this is only an example, and is not intended to limit the scope of the disclosure.

Each cell string (e.g., NS11) may include a string select transistor SST, a plurality of memory cells MC, and a ground select transistor GST that are coupled in series. The string select transistor SST may be coupled to a corresponding string select line SSL1. The plurality of memory cells MC may be coupled to the corresponding word lines WL1 to WL8, respectively. The ground select transistor GST may be coupled to the ground select line GSL. The string select transistor SST may be coupled to the corresponding bit lines BL1 to BL3, and the ground select transistor GST may be coupled to the common source line CSL.

In some embodiments, each cell string may be provided with one or more dummy memory cells between the string select transistor SST and the memory cells MC. Each cell string may be provided with one or more dummy memory cells between the ground select transistor GST and the memory cells MC. Each cell string may be provided with one or more dummy memory cells between the memory cells MC. The dummy memory cells may have the same structure as the memory cells MC and may be unprogrammed (e.g., program-inhibited) or may be programmed differently from the memory cells MC. For example, when the memory cells MC are programmed to have two or a larger number of threshold voltage distributions, the dummy memory cells may be programmed to have one threshold voltage distribution range or a smaller number of threshold voltage distributions than the memory cells MC.

Figure 3A:
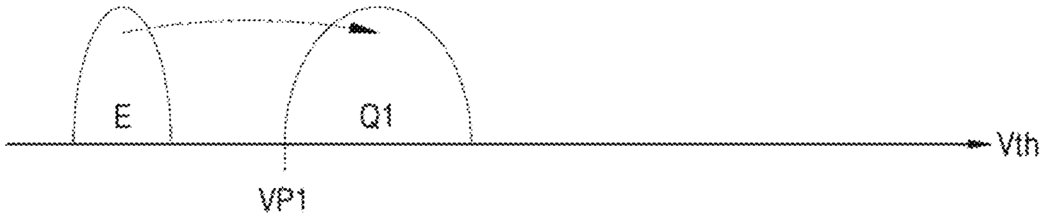
FIGS. 3A, 3B and 3C are diagrams illustrating a programming process according to embodiments.
Figure 3B:
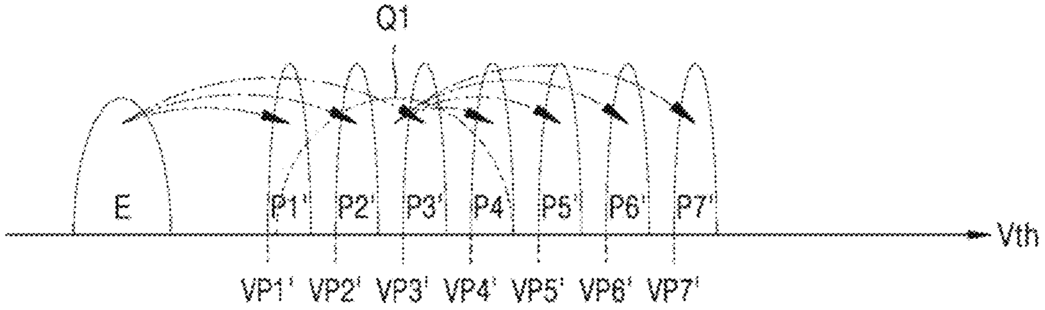
Figure 3C:
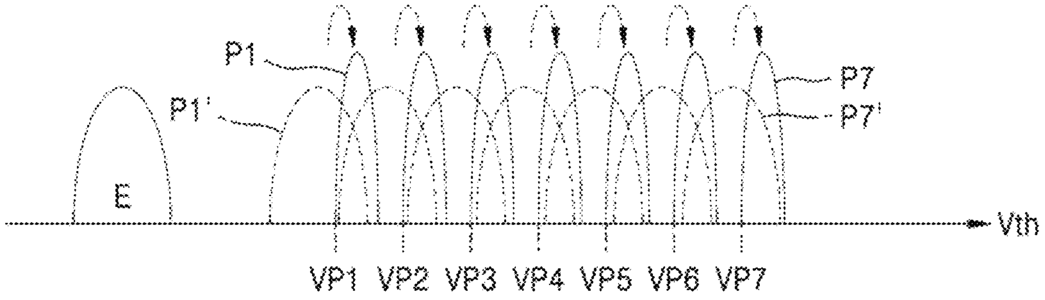

FIGS. 3A, 3B and 3C are diagrams illustrating a programming process according to embodiments. Although the example shown in FIGS. 3A, 3B and 3C relates to a memory device which stores three bits of data per memory cell and performs a program operation according to a two-step programming process. For example, the program operation based on the two-step programming process including a coarse program and a fine program is described below. However, embodiments are not limited thereto.

First, first page data is simultaneously stored in memory cells of a selected word line. As shown in FIG. 3A, memory cells belonging to a threshold voltage distribution corresponding to an erase state E are programmed to have threshold voltages belonging to threshold voltage distributions corresponding to a program state Q1, according to data to be programmed.

Next, two pages of data, for example second page data and third page data, are simultaneously stored in the memory cells of the selected word line (i.e each memory cell stores a bit of each of two pages). As shown in FIG. 3B, memory cells belonging to the threshold voltage distribution corresponding to the erase state E are programmed to have threshold voltages belonging to threshold voltage distributions respectively corresponding to program states P1' to P3', according to data to be programmed. The memory cells belonging to the threshold voltage distribution corresponding to the program state Q1 of FIG. 3A are programmed to have threshold voltages belonging to threshold voltage distributions respectively corresponding to program states P4' to P7', according to data to be programmed.

Here, verification voltages VP1' to VP7' used to determine the threshold voltage distributions P1' to P7' are lower than verification voltages VP1 to VP7 used to determine final threshold voltage distributions P1 to P7 (as shown for example in FIG. 3C). For example, the verification voltage VP1' used to determine the threshold voltage distribution P1' is lower than the verification voltage VP1 used to determine the corresponding final threshold voltage distribution P1. An operation of programming the memory cells to have the threshold voltage distributions P1' to P7' shown in FIG. 3B may be referred to as a coarse program operation, and an operation of programming the memory cells belonging to the threshold voltage distributions P1' to P7' to have the final threshold voltage distributions P1 to P7 (shown in FIG. 3C) may be referred to as a fine program operation (or a reprogram operation).

Figure 4A:
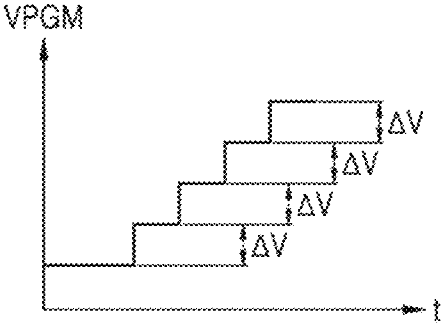
FIGS. 4A and 4B are diagrams illustrating a programming process according to embodiments.
Figure 4B:
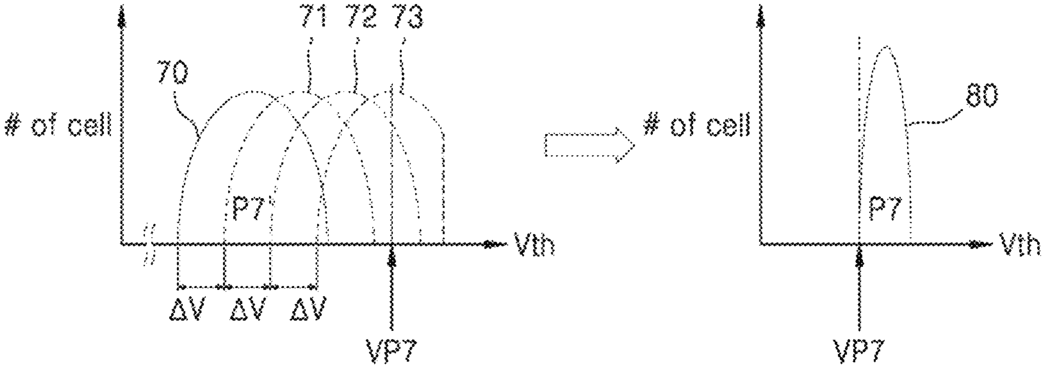

FIGS. 4A and 4B are diagrams illustrating a programming process according to embodiments.

Referring to FIGS. 4A and 4B, memory cells may be programmed by a plurality of step pulse voltages each corresponding to a program voltage VPGM which is higher than a program voltage VPGM of a preceding step pulse voltage by a voltage increment ΔV such that the memory cells are moved from a first threshold voltage distribution 70 to a second threshold voltage distribution 80. Because the step pulse voltages increasing uniformly by the voltage increment ΔV may be provided to a word line of selected memory cells, a distribution of the memory cells may move sequentially in an order of the first threshold voltage distribution 70, followed by an intermediate threshold voltage distribution 71, followed by an intermediate threshold voltage distribution 72, followed by an intermediate threshold voltage distribution 73, and so on, until the second threshold voltage distribution 80 is reached. It may be desirable for a threshold voltage distribution of memory cells finally formed after program ending to be maintained as the second threshold voltage distribution 80. FIG. 4B illustrates an example in which the first threshold voltage distribution 70 may correspond to the threshold voltage distribution P7' of FIG. 3C, and the second threshold voltage distribution 80 may correspond to the final threshold voltage distribution P7, but this is only an example, and embodiments are not limited thereto.

In some embodiments, the number of program loops may be determined by the voltage increment ΔV used to generate the plurality of step pulse voltages. A voltage shift in each program loop when a small voltage increment ΔV is applied may appear small, and a voltage shift in each program loop when a large voltage increment ΔV is applied may appear large. When the same voltage is shifted, the number of program loops used when the large voltage increment ΔV is applied may be less than the number of program loops used when the small voltage increment ΔV is applied. The small number of program loops may mean that the program speed is fast because the number of repeated programs is small. Conversely, the large number of program loops may mean that the program speed is slow because the number of repeated programs is large.

Figure 5:
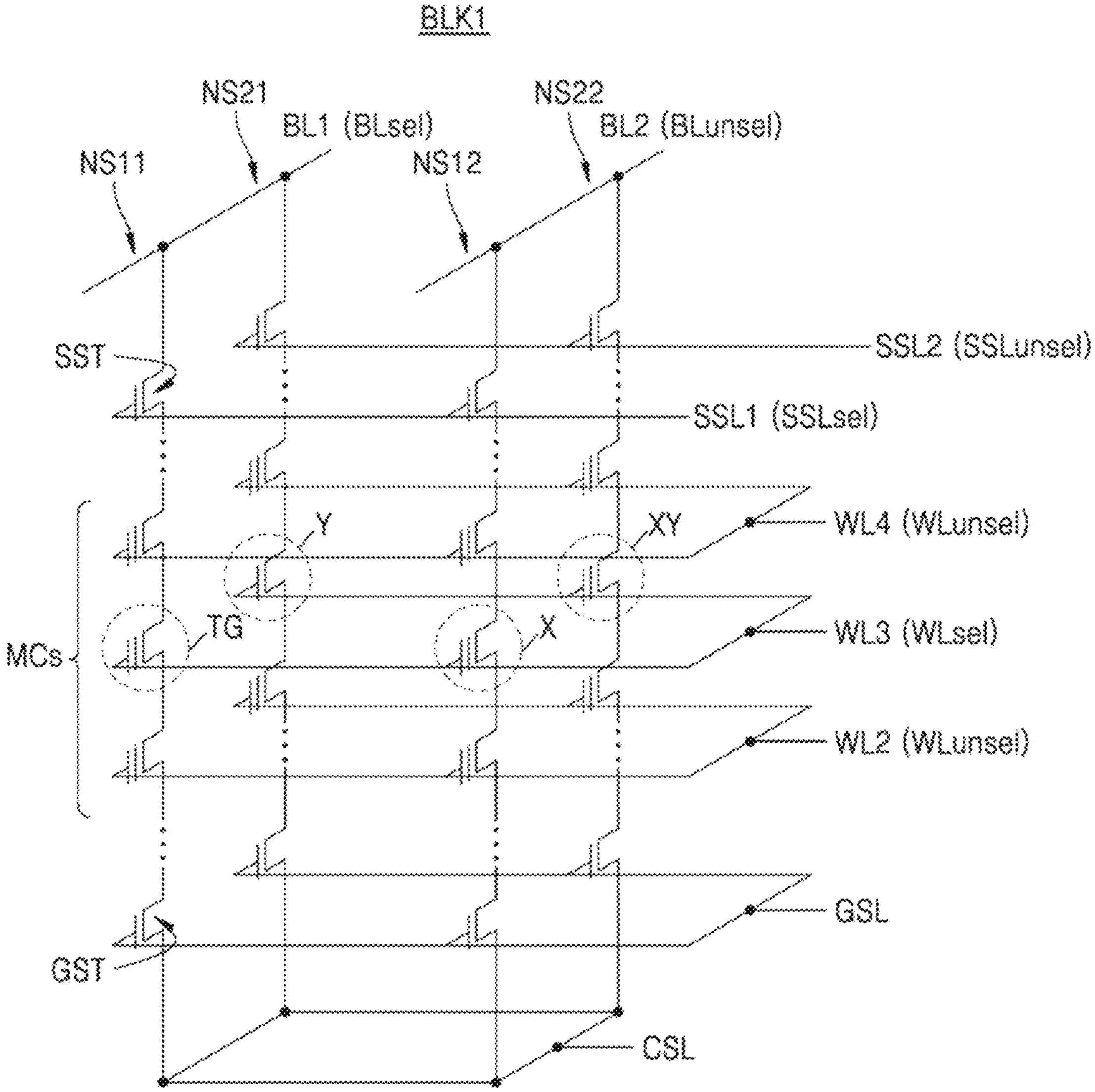
FIGS. 5, 6, and 7 are diagrams illustrating a programming process according to embodiments.
Figure 6:
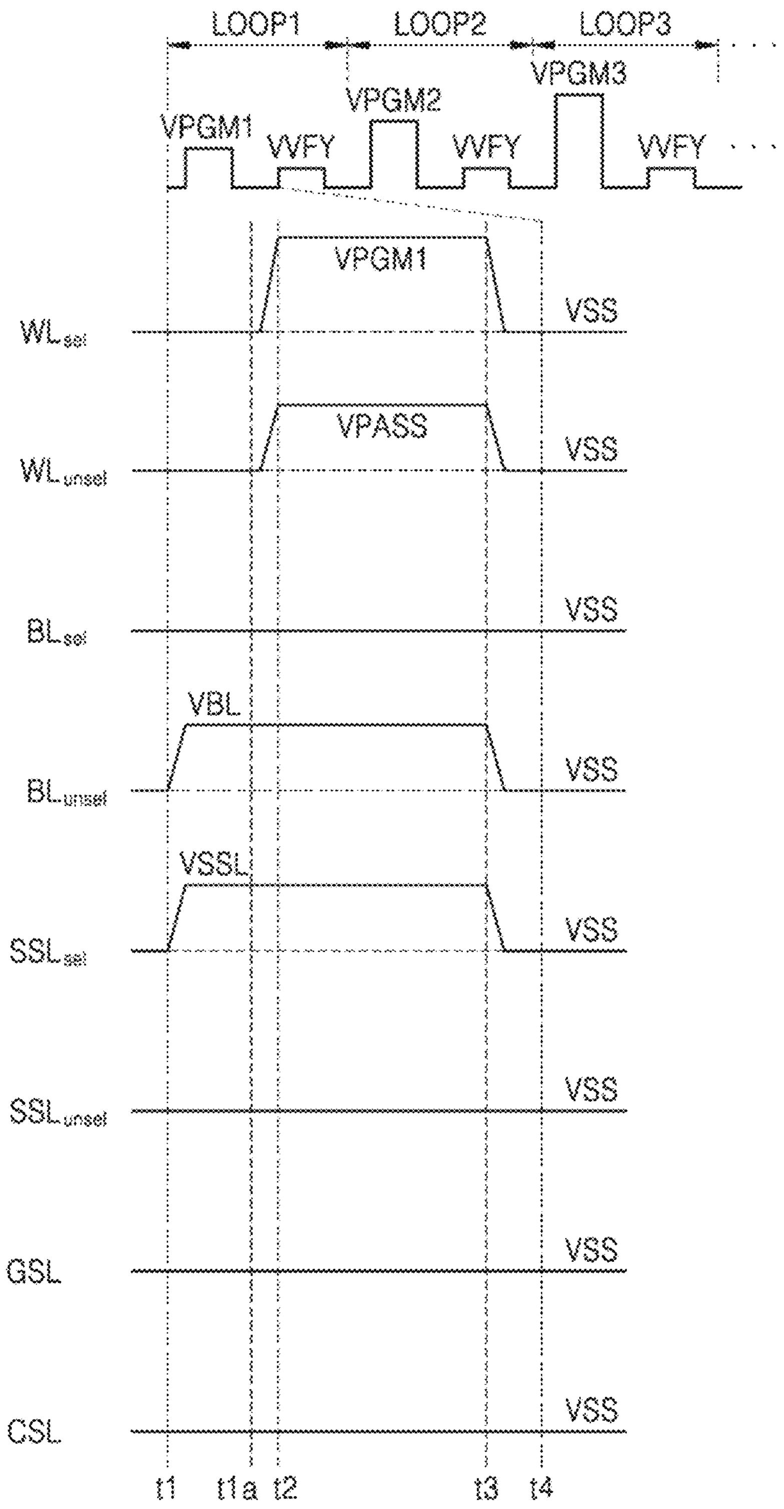
Figure 7:
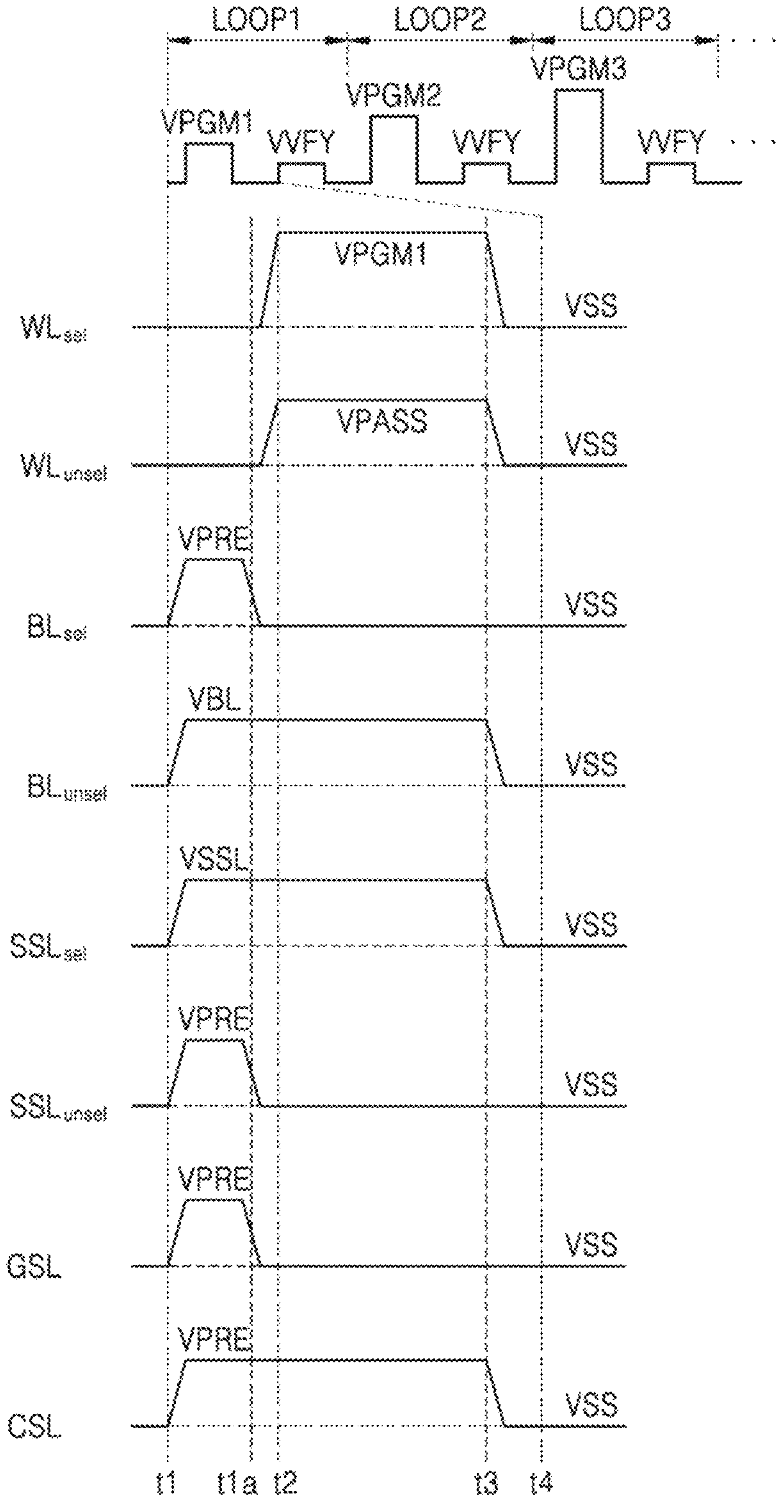

FIGS. 5, 6, and 7 are diagrams illustrating a programming process according to embodiments. For convenience of illustration, FIG. 5 only shows cell strings NS11 and NS21 coupled to a first bit line BL1 and cell strings NS12 and NS22 coupled to a second bit line BL2, from among the cell strings NS11 to NS33 of the first memory block BLK1 illustrated in FIG. 2. In addition, in relation to a selected memory cell TG programmed in the NS11 cell string, it may be understood that a selected word line WLsel may correspond to a word line WL3, unselected word lines WLunsel may correspond to word lines WL2 and WL4, a selected string select line SSLsel may correspond to a string select line SSL1, an unselected string select line SSLunsel may correspond to a string select line SSL2, a selected bit line BLsel may correspond to a bit line BL1, and an unselected bit line BLunsel may correspond to a bit line BL2. It should be noted that in the timing diagrams described below, a horizontal axis and a vertical axis indicate a time and a voltage level, respectively, and are not necessarily drawn at a constant ratio.

Referring to FIGS. 5 and 6, a plurality of program loops LOOP1, LOOP2, LOOP3, etc., may be sequentially performed on memory cells coupled to the selected word line WLsel until a program is completed according to incremental step pulse programming (ISPP). As the program loops are repeated, program voltages VPGM1, VPGM2, VPGM3, etc., may increase step by step. Each program loop LOOPi (where i is a natural number) may include a program duration in which a program voltage VPGMi is applied to the selected word line WLsel in order to program the selected memory cell TG and a verification duration of applying a verification voltage VVFY to the selected word line WLsel in order to verify whether the programming is successful. The program duration of the program loop LOOPi may include a precharge duration and a program execution duration. An example corresponding to the program duration of the first program loop LOOP1 is described below, in which the precharge duration of the program duration refers to a duration between time t1 and time t2 and the program execution duration of the program duration refers to a duration between time t2 and time t3, but embodiments are not limited thereto. The remaining program loops LOOP2, LOOP3, etc., may be similar to the first program loop LOOP1, except that the program voltages VPGM2, VPGM3, etc. applied to the selected word line WLsel may increase step by step during the program execution durations.

According to the example shown in FIG. 6, in the precharge duration between time t1 and time t2, a ground voltage VSS may be applied to the selected word line WLsel and the unselected word lines WLunsel, a ground voltage VSS of a program-permitted voltage level may be applied to the selected bit line BLsel, and a bit line voltage VBL of a program-inhibited voltage level may be applied to the unselected bit line BLunsel. An activation voltage VSSL may be applied to the selected string select line SSLsel, and a ground voltage VSS may be applied to the unselected string select line SSLunsel, a ground select line GSL, and a common source line CSL. In embodiments, the activation voltage VSSL may be referred to as a turn-on voltage.

In the program execution duration between time t2 and time t3, a program voltage VPGM1 may be applied to the selected word line WLsel, and a program pass voltage VPASS may be applied to the unselected word lines WLunsel. The program pass voltage VPASS may be provided as a voltage level capable of always activating or turning on a memory cell regardless of a program state of the memory cell.

In this program duration, 18 V may be applied to a gate of the selected memory cell TG programmed in the NS11 cell string, and a channel voltage may be 0 V. Because a strong electric field may be formed between the gate of the selected memory cell TG and a channel, the selected memory cell TG may be programmed. Because a channel voltage of a memory cell X adjacent to the selected memory cell TG may be a power supply voltage VDD, and a weak electric field may be formed between a gate of the memory cell X and a channel, the memory cell X may be not programmed. Because channels of memory cells Y and XY adjacent to the selected memory cell TG may be in a floating state, a channel voltage may rise to a boosting level by the pass voltage VPASS, and the memory cells Y and XY may be not programmed.

In some embodiments, in the verification duration after the program duration, a read pass voltage capable of always activating or turning on a memory cell regardless of a program state of the memory cell may be applied to the unselected word line WLunsel, and a verification voltage VVFY may be applied to the selected word line WLsel. In addition, an activation voltage may be applied to a selected ground select line GSL, and a deactivation voltage may be applied to an unselected ground select line GSL. In embodiments, the deactivation voltage may be referred to as a turn-off voltage. In this verification duration, it may be determined whether the selected memory cell TG has been programmed to a target program state.

The programming process described with reference to FIG. 6 may be referred to as a comparative example scheme. In contrast with the comparative example scheme, some embodiments may relate to a bidirectional precharge (BP) scheme. An example of the BP scheme is explained with reference to FIG. 7, but some description which is redundant or duplicative with the description of the comparative example scheme of FIG. 6 is omitted.

Referring to FIG. 7, in the precharge duration between time t1 and time t2, a ground voltage VSS may be applied to the selected word line WLsel and the unselected word lines WLunsel, and a precharge voltage VPRE may be applied to the selected bit line BLsel, and a bit line voltage VBL of a program-inhibited voltage level may be applied to the unselected bit line BLunsel. An activation voltage VSSL may be applied to the selected string select line SSLsel, and a precharge voltage VPRE may be applied to the unselected string select line SSLunsel, the ground select line GSL, and the common source line CSL. According to an embodiment, the activation voltage VSSL may be provided as a voltage level which is equal to or higher than a threshold voltage Vth of each string select transistor SST, and the precharge voltage VPRE may be provided as a voltage level higher than the ground voltage VSS. According to another embodiment, the precharge voltage VPRE may be provided as a power supply voltage VDD level.

In some embodiments, according to the BP scheme, channels of a plurality of cell strings may be precharged through a selected string select transistor SST coupled to the unselected string select line SSLunsel, and may be precharged through a ground select transistor GST coupled to the ground select line GSL In the program execution duration between time t2 and time t3, the program voltage VPGM1 may be applied to the selected word line WLsel, and a program pass voltage VPASS may be applied to the unselected word lines WLunsel. The ground voltage VSS may be applied to the selected bit line BLsel, the unselected string select line SSLunsel, and the ground select line GSL.

Figure 9:
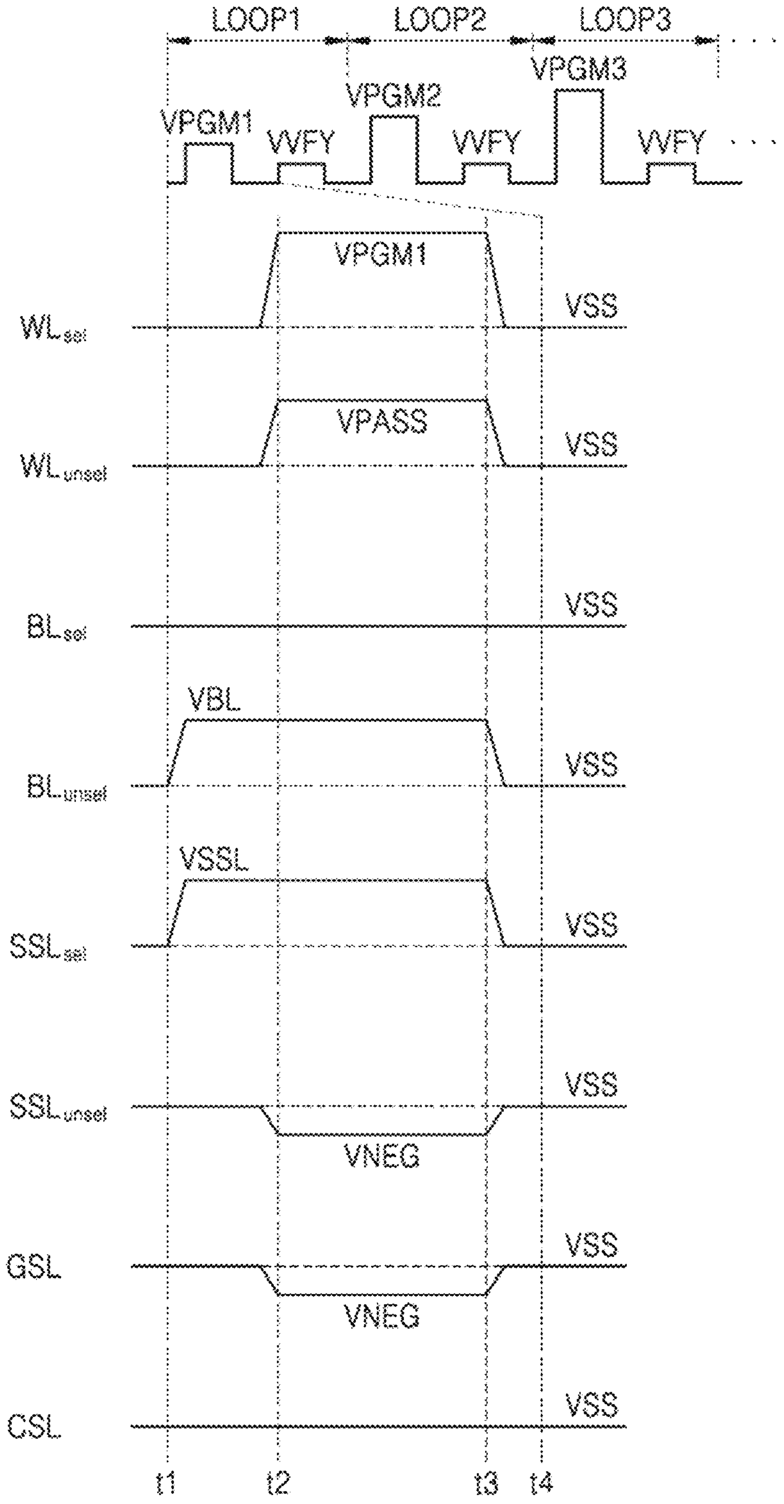

FIGS. 8 and 9 are diagrams illustrating a programming process according to embodiments. The programming process of FIG. 8 may be similar to the BP scheme of FIG. 7, except that the programming process of FIG. 8 may suppress a program disturbance using a negative (−) voltage in the program execution duration. The programming process of FIG. 8 may be referred to as a BPNB scheme. In the description of the example BPNB scheme described below with reference to FIG. 8, some description which is redundant or duplicative with the description of the comparative example scheme of FIG. 6 and the BP scheme of FIG. 7 is omitted.

Referring to FIG. 8, in the precharge duration between time t1 and time t2, a ground voltage VSS may be applied to the selected word line WLsel and the unselected word lines WLunsel, a bit line voltage VBL of a program-inhibited voltage level may be applied to the unselected bit line BLunsel, and a precharge voltage VPRE may be applied to the selected bit line BLsel. An activation voltage VSSL may be applied to the selected string select line SSLsel, and a precharge voltage VPRE may be applied to the unselected string select line SSLunsel, the ground select line GSL, and the common source line CSL.

In the program execution duration between time t2 and time t3, a program voltage VPGM1 may be applied to the selected word line WLsel, and a program pass voltage VPASS may be applied to the unselected word lines WLunsel. A ground voltage VSS may be applied to the selected bit line BLsel. A negative voltage VNEG may be applied to the unselected string select line SSLunsel and the ground select line GSL. The negative voltage VNEG may be provided as a voltage level lower than the ground voltage VSS.

In the precharge duration between time t1 and time t2, the BPNB scheme of FIG. 8 may stably boost a channel potential by precharge performed in both directions of the bit line BL and the common source line CSL. In the program execution duration between time t2 and time t3, a channel may be clearly disconnected by the negative voltage VNEG applied to the unselected string select line SSLunsel and ground select line GSL, and thus a leakage of electrons coming from the bit line BL and the common source line CSL may be blocked, preventing a decrease of the channel potential. Accordingly, a self-boosting effect may be maximized and program disturbance may be suppressed.

FIG. 9 shows a modified example of the BPNB scheme of FIG. 8. Referring to FIG. 9, in the precharge duration between time t1 and time t2, a ground voltage VSS may be applied to the selected word line WLsel and the unselected word lines WLunsel, a ground voltage VSS may be applied to the selected bit line BLsel, and a bit line voltage VBL may be applied to the unselected bit line BLunsel. An activation voltage VSSL may be applied to the selected string select line SSLsel, and a ground voltage VSS may be applied to the unselected string select line SSLunsel, the ground select line GSL, and the common source line CSL.

In the program execution duration between time t2 and time t3, a program voltage VPGM1 may be applied to the selected word line WLsel, and a program pass voltage VPASS may be applied to the unselected word lines WLunsel. A negative voltage VNEG may be applied to the unselected string select line SSLunsel and the ground select line GSL.

FIGS. 10, 11, 12, 13A, 13B, 14A, and 14B are diagrams illustrating examples of the effect of suppressing program disturbance by programming processes according to embodiments.

Figure 10:
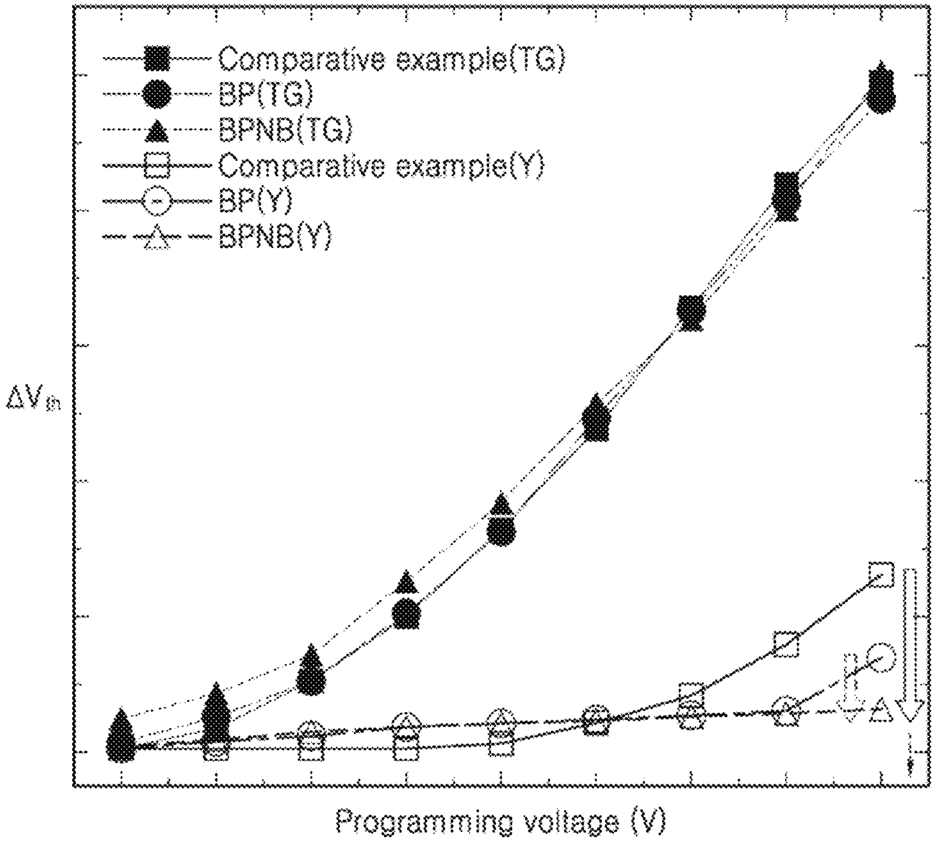
FIGS. 10, 11, 12, 13A, 13B, 14A, and 14B are diagrams illustrating the effect of suppressing program disturbance by programming process according to embodiments.

FIG. 10 shows example results of comparing a program efficiency and disturbance degree of the comparative example scheme of FIG. 6, the BP scheme of FIG. 7, and the BPNB scheme of FIG. 8.

Referring to FIG. 10, as a ΔVth value increases, a program efficiency is superior in a selected memory cell TG. The ΔVth value may be expressed according to Equation 1 below:

$$\Delta Vth = Vth{,}pgm - Vth{,}ers \quad \text{(Equation 1)}$$

In Equation 1 above, Vth,pgm may denote a threshold voltage of a program state, and Vth,ers may denote a threshold voltage of an erase state. The program efficiency may be superior as the ΔVth value increases because a threshold voltage of a target program state may be reached faster at the same program voltage. In contrast, as the ΔVth decreases, the degree of program disturbance may be superior in a memory cell Y because the memory cell Y may be designed not to be programmed from the beginning. FIG. 10 shows that the BPNB scheme may reduce the program disturbance without decreasing the program efficiency, compared to the comparative example scheme. In other words, the BPNB scheme may be effective in suppressing the program disturbance.

Figure 11:
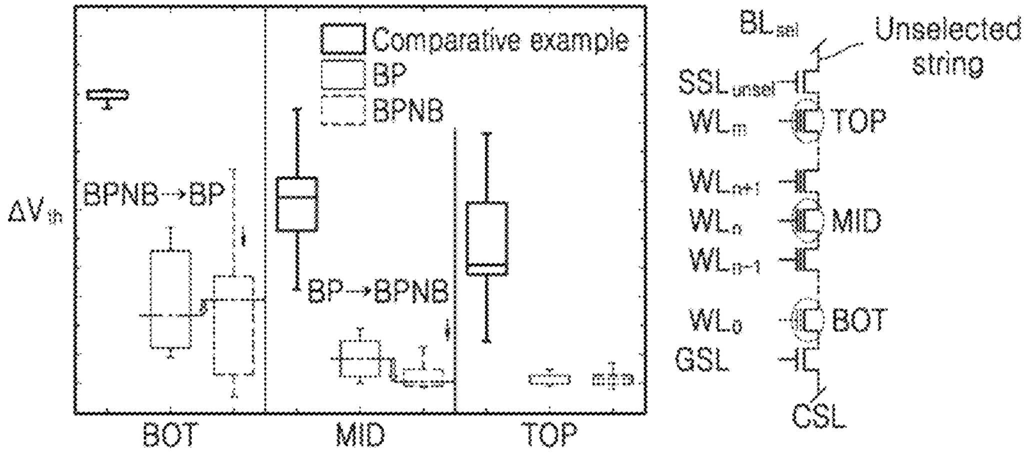

FIG. 11 shows example results of examining the degree of ΔVth disturbance based on a word line WL position in one NAND string in accordance with the comparative example scheme of FIG. 6, the BP scheme of FIG. 7, and the BPNB scheme of FIG. 8.

Referring to FIG. 11, ΔVth disturbance of all the schemes appears large in bottom word lines BOT of a ground select line GSL side. This is because, as hole diameters of the bottom word lines BOT decrease due to a tapered channel, a strong electric field may be applied and thus the ΔVth disturbance also appears large. FIG. 11 shows that the BP scheme may be slightly superior to the BPNB scheme in terms of the degree of ΔVth disturbance of the bottom word lines BOT, and the BPNB scheme may be significantly superior to the BP scheme in terms of the degree of ΔVth disturbance of middle word lines MID. Because many NAND cells may have a structure in which word lines WL are located in both directions like the middle word lines MID, it may be advantageous to use the BPNB scheme applicable to more NAND cells.

Figure 12:
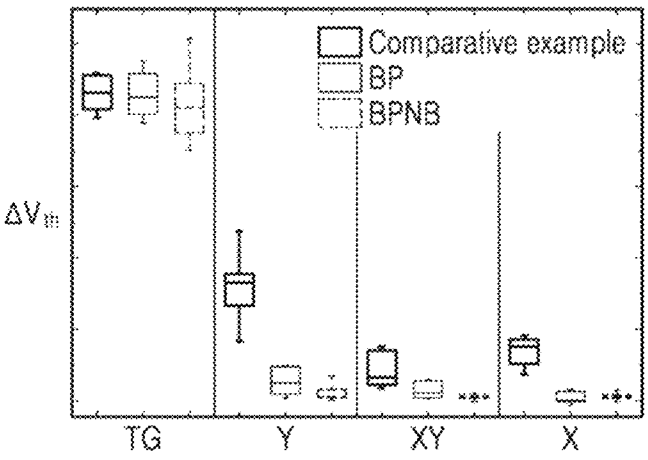

FIG. 12 shows example results of examining the degree of ΔVth disturbance of a selected memory cell TG and adjacent memory cells X, Y, and XY in accordance with the comparative example scheme of FIG. 6, the BP scheme of FIG. 7, and the BPNB scheme of FIG. 8.

Referring to FIGS. 5 and 12, in accordance with BPNB scheme bias conditions, a precharge voltage VPRE may be applied, during a precharge duration, to a bit line BL to which a selected memory cell TG is coupled and then may be changed to a ground voltage VSS level during a program execution duration, and an activation voltage VSSL may be applied, during the precharge duration and the program execution duration, to a string select line SSL to which the selected memory cell TG is coupled. A precharge voltage VPRE may be applied, during the precharge duration, to a bit line BL to which a memory cell Y is coupled, and then may be changed to a ground voltage VSS level during the program execution duration, and a precharge voltage VPRE may be applied, during the precharge duration, to a string select line SSL to which the memory cell Y is coupled and then may be changed to a negative voltage VNEG during the program execution duration. A bit line voltage VBL may be applied, during the precharge duration and the program execution duration, to a bit line BL to which a memory cell XY is coupled, and a precharge voltage VPRE may be applied, during the precharge duration, to a string select line SSL to which the memory cell XY is coupled and then may be changed to a negative voltage VNEG during the program execution duration. A bit line voltage VBL may be applied, during the precharge duration and the program execution duration, to a bit line BL to which a memory cell X is coupled, and an activation voltage VSSL may be applied, during the precharge duration and the program execution duration, to a string select line SSL to which the memory cell X is coupled. FIG. 12 shows that the BPNB scheme does not deteriorate a program efficiency of the selected memory cell TG, and causes little ΔVth disturbance of the adjacent memory cells Y, XY, and X. In other words, the BPNB scheme is effective in program disturbance suppression.

Figure 13A:
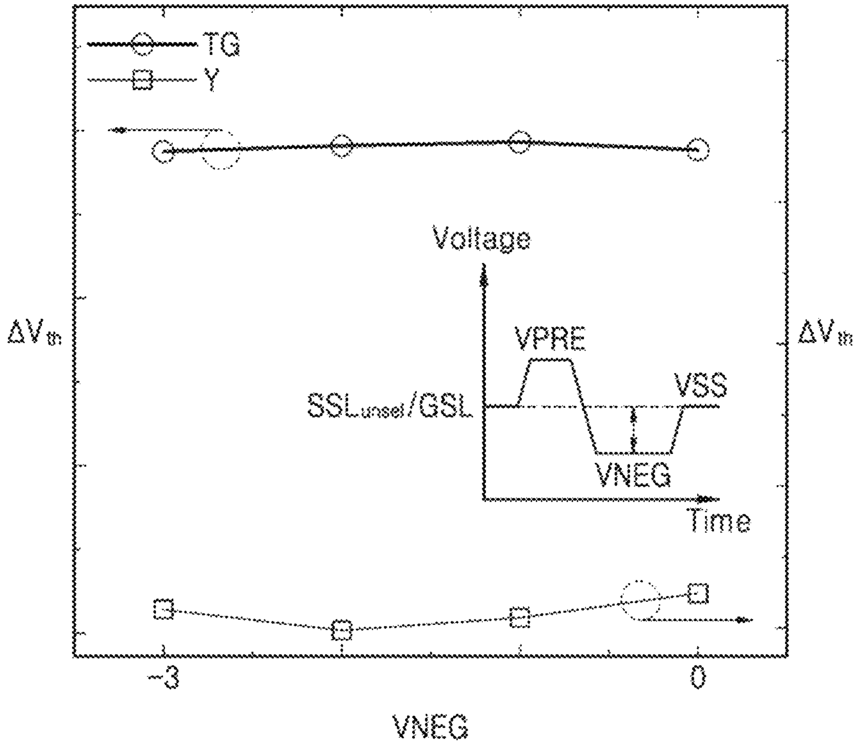
Figure 13B:
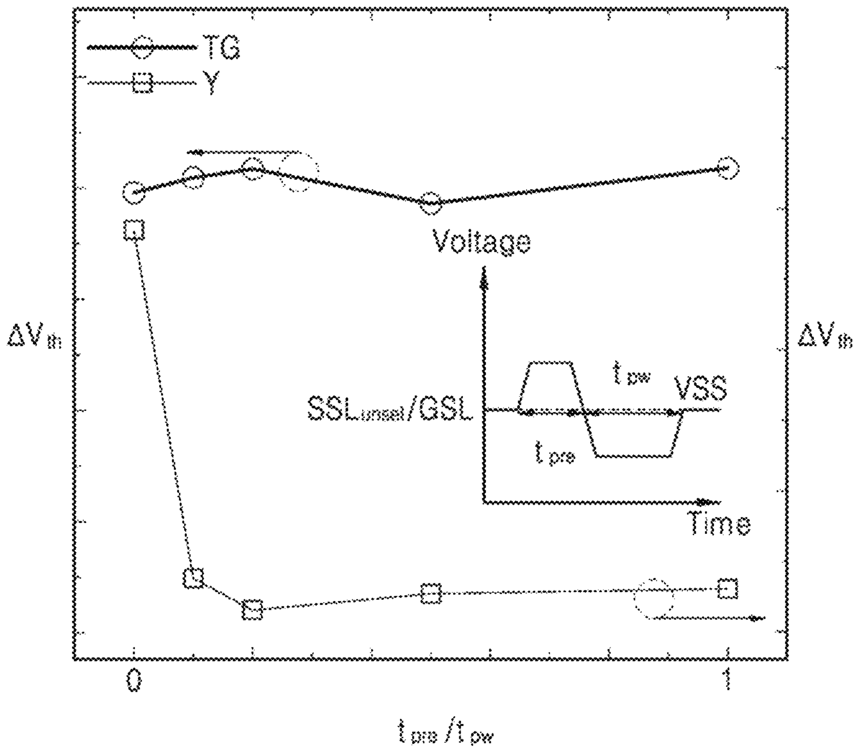

FIGS. 13A and 13B show ΔVth disturbance based on a negative voltage VNEG and a precharge time tpre of a BPNB scheme. In each of FIGS. 13A and 13B, the left arrow indicates the ΔVth disturbance of the memory cell TG and the right arrow indicates the ΔVth disturbance of the memory cell Y. The ΔVth disturbance ranges of the memory cell TG and the memory cell Y may be different. The reference character $t_{pw}$ represents the program time, and $t_{pre}/t_{pw}$ represents the shortness of the precharge time compared to the program time.

Referring to FIG. 13A, as the magnitude of a negative voltage VNEG increases, a leakage current resulting from an increase of a gate induced drain leakage (GIDL) current may increase and thus, ΔVth disturbance may increase. The occurrence of a sudden edge potential change inducing the GIDL current may be prevented using dummy word lines and thus, the increase of the ΔVth disturbance may be prevented.

Referring to FIG. 13B, as a precharge time tpre increases, the total program time may increase, and it may be seen that the ΔVth disturbance appears similar except for tpre/tpw=0.

Figure 14A:
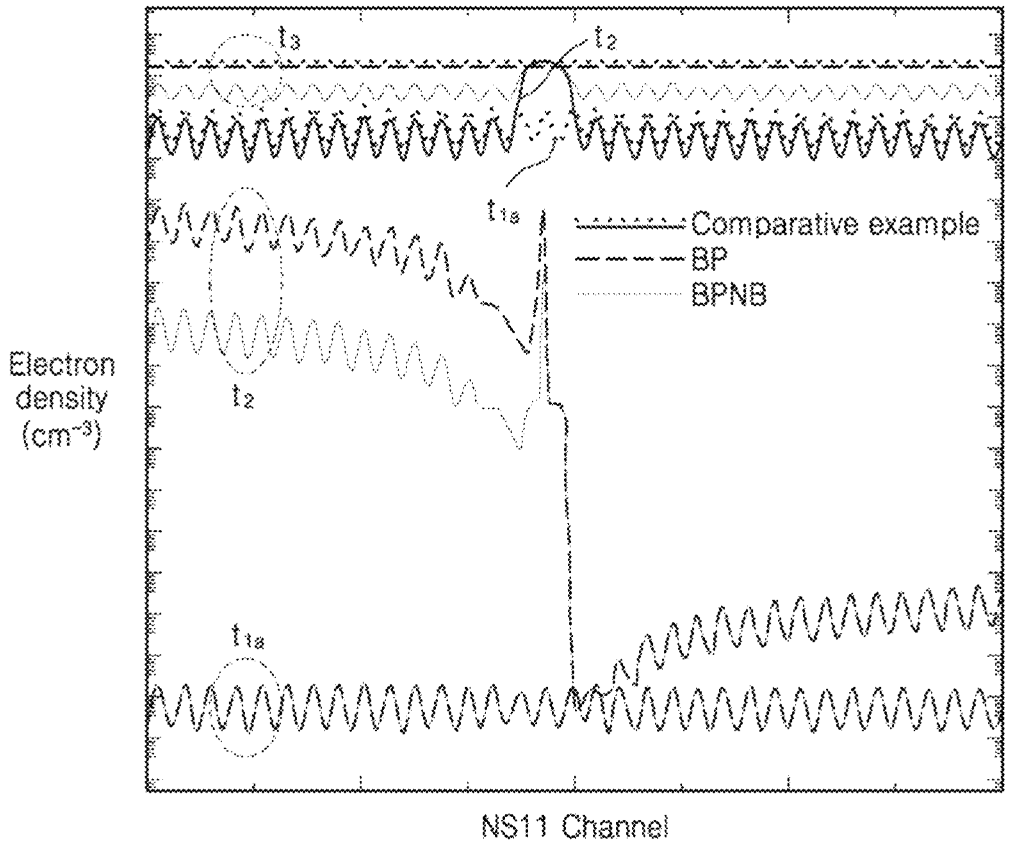
Figure 14B:
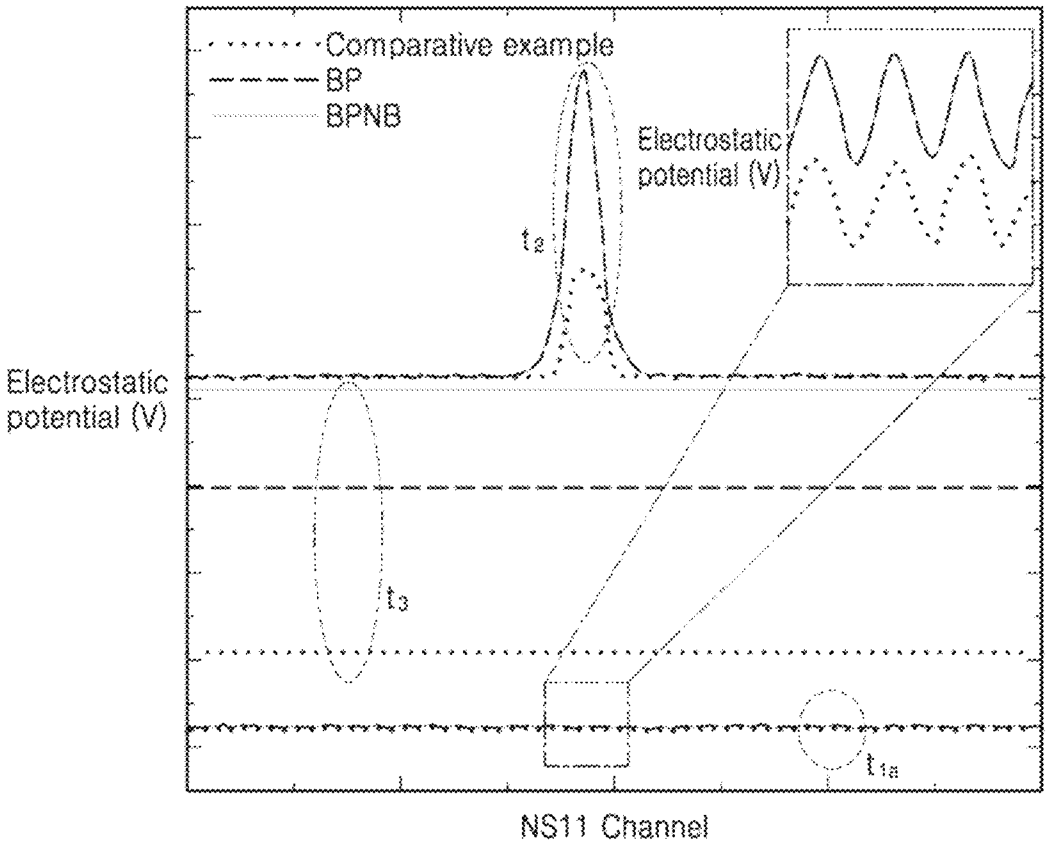

FIGS. 14A and 14B show an electron density and a channel potential based on the comparative example scheme of FIG. 6, the BP scheme of FIG. 7, and the BPNB scheme of FIG. 8 in a NAND string NS11 of a selected memory cell TG.

Referring to FIG. 14A, at time t1*a*, when a precharge duration ends, it may be seen that electron densities of the BP scheme and the BPNB scheme are smaller than that of the comparative example scheme. This is because a channel between a bit line BL and a common source line CSL is disconnected and becomes a floating node. At time t2, when a program execution duration begins, the electron densities of the BP scheme and the BPNB scheme gradually increase, but because the electron density of the comparative example scheme is already large, program disturbance may be expected to worsen in the comparative example scheme. At time t3, when the program execution duration ends, it may be seen that the electron density of the BPNB scheme is lowest. This may mean that a leakage of electrons coming from a bit line BL and a common source line CSL is prevented by a negative voltage VNEG applied to an unselected string select line SSLunsel and a ground select line GSL.

Referring to FIG. 14B, at time t1*a*, when the precharge duration ends, a channel potential of the comparative example scheme appears to be lowest, and this may mean that the comparative example scheme may be vulnerable to program disturbance. At time t2, when the program execution duration begins, a self-boosting effect appears in all the schemes, but it may be seen that because the electron density of the comparative example scheme is largest, the channel potential of the comparative example scheme is smallest. At time t3 when the program execution duration ends, it may be seen that a channel potential of the BPNB scheme is maintained at the highest level. This may mean that the self-boosting effect is maximized and a leakage of electrons coming from a bit line BL and a common source line CSL is small. When the channel potential is large, the magnitude of an electric field between a word line WL and a channel may be reduced, thereby preventing the program disturbance.

Figure 15:
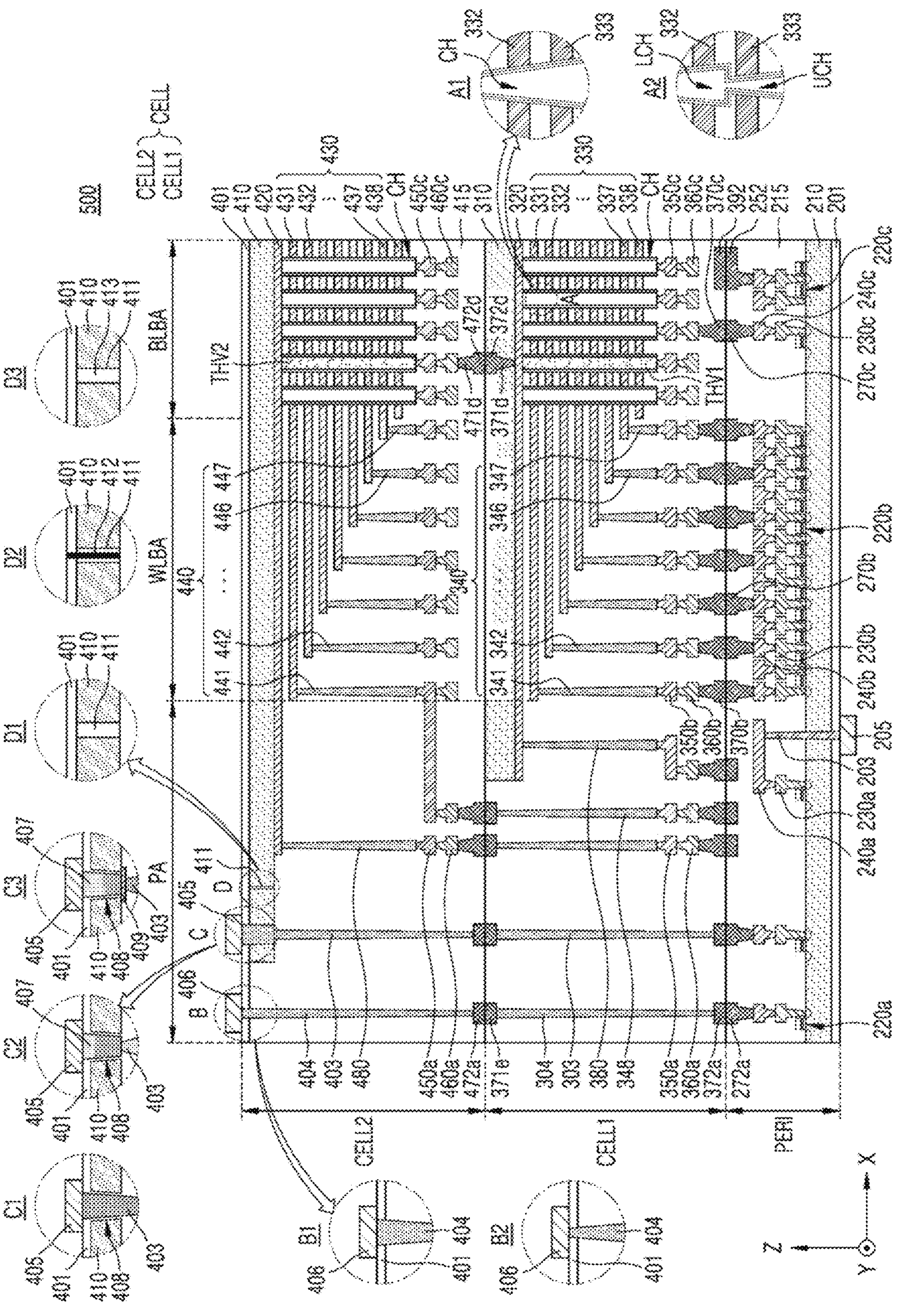
FIG. 15 is a diagram illustrating a memory device according to an embodiment.

FIG. 15 is a view illustrating a memory device 500 according to some embodiments.

Referring to FIG. 15, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding process to create the C2C structure. For example, the bonding process may refer a process of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding process may be a Cu—Cu bonding process. In some embodiments, the bonding metal patterns may be formed of aluminum (Al) or tungsten (W).

The memory device 500 may include the at least one upper chip including the cell region. For example, as illustrated in FIG. 15, the memory device 500 may include two upper chips. However, the number of upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other using the bonding process to manufacture the memory device 500. The first upper chip may be turned over and then may be connected to the lower chip by the bonding process, and the second upper chip may also be turned over and then may be connected to the first upper chip using the bonding process. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 15. However, embodiments are not limited thereto. For example, in some embodiments, one of the first upper chip and the second upper chip may be turned over and then may be connected to a corresponding chip using the bonding process.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the present embodiments. However, embodiments are not limited thereto. For example, in some embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (including for example word line 331 to word line 338) may be stacked on the second substrate 310 in a direction (i.e., the Z-axis direction) perpendicular to a top surface of the second substrate 310. String selection lines and a ground selection line may be disposed on and under the plurality of word lines 330, and the plurality of word lines 330 may be disposed between the string selection lines and the ground selection line. Similarly, the second cell region CELL2 may include a third substrate 410 and a common source line 420, and a plurality of word lines 430 (including for example word line 431 to word line 438) may be stacked on the third substrate 410 in a direction (e.g., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the plurality of word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 500 according to embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. In some embodiments, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it may be possible to reduce an influence of a non-uniform channel width between the lower and upper channels LCH and UCH on an operation of the memory device.

In embodiments, the number of the lower word lines 331 and 332 penetrated by the lower channel LCH may be less than the number of the upper word lines 333 to 338 penetrated by the upper channel UCH in the region 'A2'. However, embodiments are not limited thereto. For example, in some embodiments, the number of lower word lines penetrated by the lower channel LCH may be equal to or greater than the number of upper word lines penetrated by the upper channel UCH. In addition, structural features and connection relationships of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 15, the first through-electrode THV1 may penetrate the common source line 320 and the plurality of word lines 330. In some embodiments, the first through-electrode THV1 may further penetrate the second substrate 310. The first through-electrode THV1 may include a conductive material. In some embodiments, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other using a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other using the bonding process.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other using the bonding process. In the bit line bonding region BLBA, the bit line 360*c* may be electrically connected to a page buffer included in the peripheral circuit region PERI. For example, some of the circuit elements 220*c* of the peripheral circuit region PERI may be included in the page buffer, and the bit line 360*c* may be electrically connected to the circuit elements 220*c* which may be included in the page buffer through an upper bonding metal pattern 370*c* of the first cell region CELL1 and an upper bonding metal pattern 270*c* of the peripheral circuit region PERI.

Referring still to FIG. 15, in the word line bonding region WLBA, the plurality of word lines 330 of the first cell region CELL1 may extend in a second direction (e.g., an X-axis direction) parallel to the top surface of the second substrate 310 and may be connected to a plurality of cell contact plugs 340 (including for example cell contact plug 341 to cell contact plug 347). First metal lines 350*b* and second metal lines 360*b* may be sequentially connected onto the plurality of cell contact plugs 340 connected to the plurality of word lines 330. In the word line bonding region WLBA, the plurality of cell contact plugs 340 may be connected to the peripheral circuit region PERI through upper bonding metal patterns 370*b* of the first cell region CELL1 and upper bonding metal patterns 270*b* of the peripheral circuit region PERI.

The plurality of cell contact plugs 340 may be electrically connected to a row decoder included in the peripheral circuit region PERI. For example, some of the circuit elements 220*b* of the peripheral circuit region PERI may be included in the row decoder, and the plurality of cell contact plugs 340 may be electrically connected to the circuit elements 220*b* included in the row decoder through the upper bonding metal patterns 370*b* of the first cell region CELL1 and the upper bonding metal patterns 270*b* of the peripheral circuit region PERI. In some embodiments, an operating voltage of the circuit elements 220*b* included in the row decoder may be different from an operating voltage of the circuit elements 220*c* included in the page buffer. For example, the operating voltage of the circuit elements 220*c* included in the page buffer may be greater than the operating voltage of the circuit elements 220*b* included in the row decoder.

Similarly, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (including for example cell contact plug 441 to cell contact plug 447). The plurality of cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other using the bonding process. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other using the bonding process in the external pad bonding region PA. Similarly, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other using the bonding process.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 15, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 in order to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively larger toward the upper insulating layer 401. In other words, a diameter of the channel structure CH described in the region 'A1' may become progressively smaller toward the upper insulating layer 401, but the diameter of the third input/output contact plug 404 may become progressively larger toward the upper insulating layer 401. For example, the third input/output contact plug 404 may be formed after the second cell region CELL2 and the first cell region CELL1 are bonded to each other using the bonding process.

In some embodiments, as illustrated in a region 'B2', the third input/output contact plug 404 may extend in the third direction (e.g., the Z-axis direction), and a diameter of the third input/output contact plug 404 may become progressively smaller toward the upper insulating layer 401. In other words, like the channel structure CH, the diameter of the third input/output contact plug 404 may become progressively smaller toward the upper insulating layer 401. For example, the third input/output contact plug 404 may be formed together with the plurality of cell contact plugs 440 before the second cell region CELL2 and the first cell region CELL1 are bonded to each other.

In some embodiments, the input/output contact plug may overlap with the third substrate 410. For example, as illustrated in a region ‘C’, the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be created using various processes.

In some embodiments, as illustrated in a region ‘C1’, an opening 408 may be formed to penetrate the third substrate 410, and the second input/output contact plug 403 may be connected directly to the second input/output pad 405 through the opening 408 formed in the third substrate 410. In this case, as illustrated in the region ‘C1’, a diameter of the second input/output contact plug 403 may become progressively larger toward the second input/output pad 405. However, embodiments are not limited thereto, and in some embodiments, the diameter of the second input/output contact plug 403 may become progressively smaller toward the second input/output pad 405.

In some embodiments, as illustrated in a region ‘C2’, the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region ‘C2’, a diameter of the contact 407 may become progressively larger toward the second input/output pad 405, and a diameter of the second input/output contact plug 403 may become progressively smaller toward the second input/output pad 405. For example, the second input/output contact plug 403 may be formed together with the plurality of cell contact plugs 440 before the second cell region CELL2 and the first cell region CELL1 are bonded to each other, and the contact 407 may be formed after the second cell region CELL2 and the first cell region CELL1 are bonded to each other.

In some embodiments illustrated in a region ‘C3’, a stopper 409 may further be formed on a bottom end of the opening 408 of the third substrate 410, as compared with the embodiments of the region ‘C2’. The stopper 409 may be a metal line formed in the same layer as the common source line 420. In some embodiments, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively smaller toward the lower metal pattern 371*e* or may become progressively larger toward the lower metal pattern 371*e*.

In some embodiments, a slit 411 may be formed in the third substrate 410. For example, the slit 411 may be formed at a certain position of the external pad bonding region PA. For example, as illustrated in a region ‘D’, the slit 411 may be located between the second input/output pad 405 and the plurality of cell contact plugs 440 in a plan view. In some embodiments, the second input/output pad 405 may be located between the slit 411 and the cell contact plugs 440 in a plan view.

In some embodiments, as illustrated in a region ‘D1’, the slit 411 may be formed to penetrate the third substrate 410. For example, the slit 411 may be used to prevent the third substrate 410 from being finely cracked when the opening 408 is formed. However, embodiments are not limited thereto, and in some embodiments, the slit 411 may be formed to have a depth ranging from about 60% to about 70% of a thickness of the third substrate 410.

In some embodiments, as illustrated in a region ‘D2’, a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some embodiments, as illustrated in a region ‘D3’, an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Because the insulating material 413 may be formed in the slit 411, it may be possible to prevent a voltage provided through the second input/output pad 405 from affecting a metal layer disposed on the third substrate 410 in the word line bonding region WLBA.

In some embodiments, the first to third input/output pads 205, 405 and 406 may be selectively formed. For example, the memory device 500 include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Similarly, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

Figure 16:
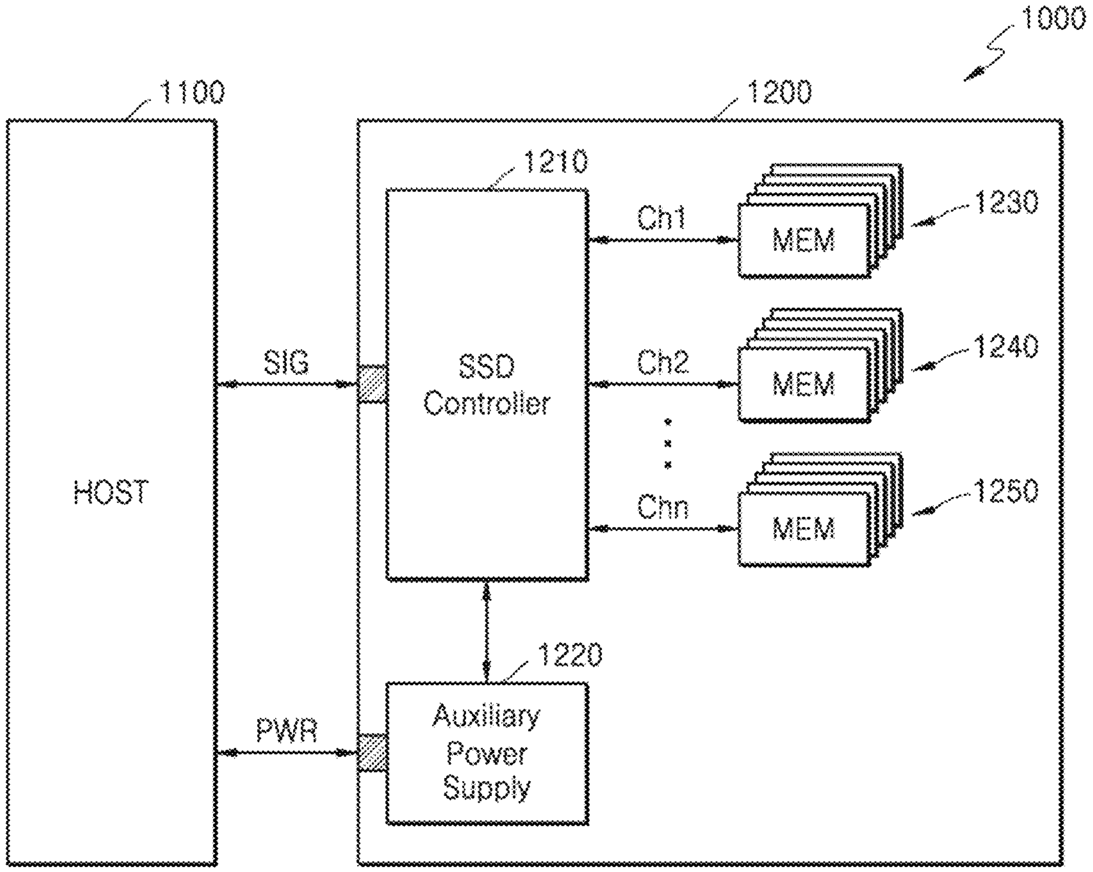
FIG. 16 is a block diagram illustrating an example of applying a memory device to a solid state drive (SSD) system according to embodiments.

FIG. 16 is a block diagram illustrating an example of applying a memory device to a solid state drive (SSD) system 1000 according to embodiments.

Referring to FIG. 16, an SSD system 1000 may include a host 1100 and an SSD 1200. The SSD 1200 exchanges signals with the host 1100 through a signal connector, and receives power through a power connector. The SSD 1200 may include an SSD controller 1210, an auxiliary power supply 1220, and memory devices 1230, 1240, and 1250. The memory devices 1230, 1240, and 1250 may include vertically stacked NAND flash memory devices. In embodiments, the SSD 1200 may be implemented using one or more of the elements described above with reference to FIGS. 1 to 15.

Figure 17:
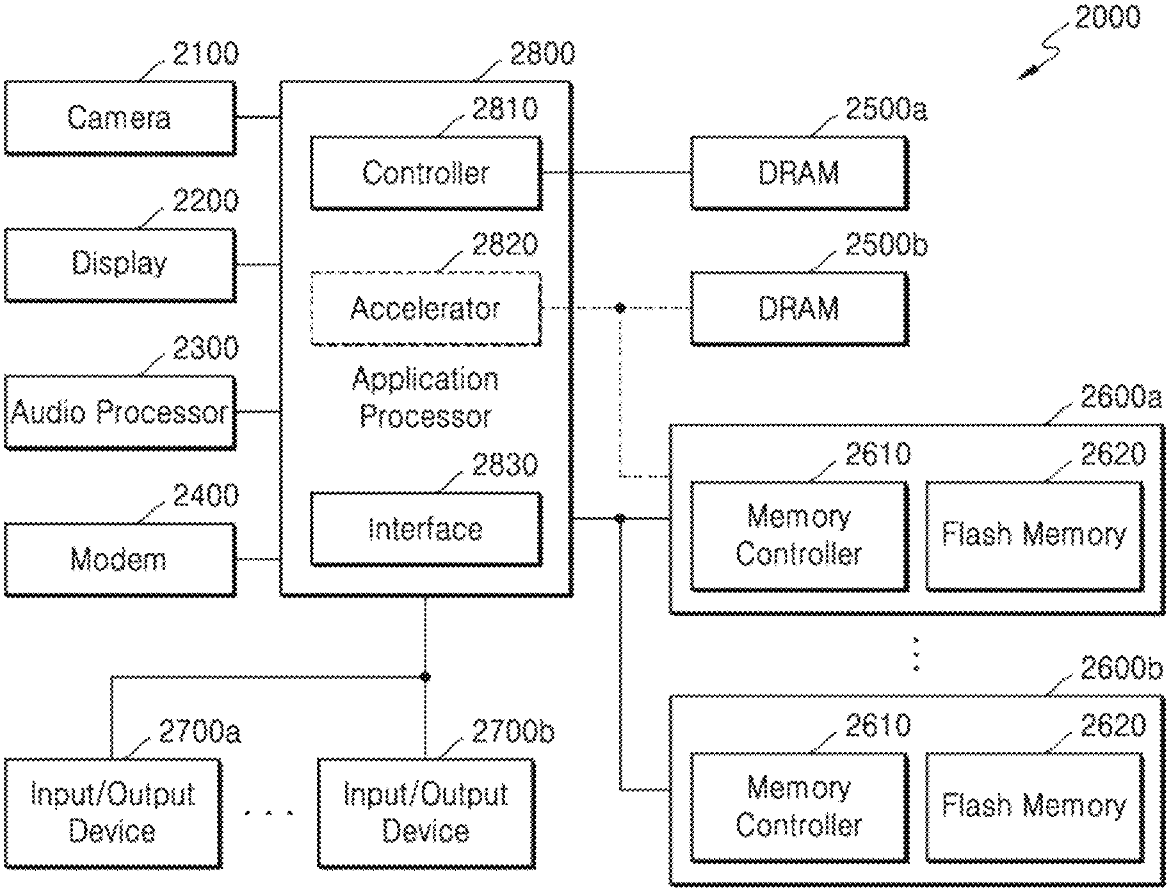
FIG. 17 is a block diagram of a system for explaining an electronic device including a memory device according to embodiments.

FIG. 17 is a block diagram of a system 2000 for explaining an electronic device including a memory device according to embodiments.

Referring to FIG. 17, a system 2000 may include a camera 2100, a display 2200, an audio processor 2300, a modem 2400, DRAMs 2500*a* and 2500*b*, flash memories 2600*a* and 2600*b*, input/output devices 2700*a* and 2700*b*, and an application processor (AP) 2800. The system 2000 may be implemented as a at least one from among a personal computer, a laptop computer, a server, a mobile phone, a smart phone, a tablet personal computer, a wearable device, a healthcare device, and an Internet Of Things (IoT) device.

The camera 2100 may capture still images or moving images under user control, and store or transmit captured image/video data to the display 2200. The audio processor 2300 may process audio data included in content of the flash memories 2600*a* and 2600*b* or a network. The modem 2400 may modulate and transmit signals for wired/wireless data transmission and reception, and demodulate and restore signals to the original signals at a receiving side. The input/output devices 2700*a* and 2700*b* may include a device providing a digital input and/or output function, such as a universal serial bus (USB), a storage, a digital camera, a secure digital (SD) card, a digital versatile disc (DVD), a network adapter, a touch screen, etc.

The AP 2800 may control the overall operation of the system 2000. The AP 2800 may include a controller block 2810, an accelerator block or accelerator chip 2820, and an interface block 2830. The AP 2800 may control the display 2200 so that part of content stored in the flash memories 2600*a* and 2600*b* is displayed on the display 2200. When a user input is received through the input/output devices 2700*a* and 2700*b*, the AP 2800 may perform a control operation corresponding to the user input. The AP 2800 may include the accelerator block, which is a dedicated circuit for artificial intelligence (AI) data operation, or may have the accelerator chip 2820 apart from the AP 2800. The DRAM 2500*b* may be additionally mounted on the accelerator block or accelerator chip 2820. The accelerator is a function block of specializing in performing a specific function of the AP 2800. The accelerator may include a GPU that is a function block of specializing in graphics data processing, a neural processing unit (NPU) that is a block for specializing in performing AI determination and inference, and a data processing unit (DPU) that is a block of specializing in data transmission.

The system 2000 may include the plurality of DRAMs 2500*a* and 2500*b*. The AP 2800 may control the DRAMs 2500*a* and 2500*b* through command and mode register (MRS) settings that meet the Joint Electron Device Engineering Council (JEDEC) standard, or may communicate by setting a DRAM interface protocol so as to use a company-specific function such as low voltage/high speed/reliability, and a cyclic redundancy check (CRC)/error correction code (ECC) function. For example, the AP 2800 may communicate with the DRAM 2500*a* through an interface that meets JEDEC standards relating to Low-Power Double Data Rate (LPDDR) such as LPDDR4 and LPDDR5, and the accelerator block or accelerator chip 2820 may communicate by setting a new DRAM interface protocol so as to control the accelerator DRAM 2500*b* having a higher bandwidth than the DRAM 2500*a*.

Although only the DRAMs 2500*a* and 2500*b* are illustrated in FIG. 17, embodiments are not limited thereto, and may be applied to any memory including a random-access memory (RAM) such as a phase-change RAM (PRAM), a static RAM (SRAM), a magnetic RAM (MRAM), a resistive RAM (RRAM_, a ferroelectric RAM (FRAM), or a hybrid RAM if bandwidth, response speed, and voltage conditions of the AP 2800 or the accelerator chip 2820 are satisfied. The DRAMs 2500*a* and 2500*b* may have relatively lower latency and bandwidth than the I/O devices 2700*a* and 2700*b* or the flash memories 2600*a* and 2600*b*. The DRAMs 2500*a* and 2500*b* may be initialized when the system 2000 is powered on, and may be used as a temporary storage of an operating system and application data when the operating system and the application data are loaded or may be used as an execution space for various software codes.

In the DRAMs 2500*a* and 2500*b*, basic operations such as addition/subtraction/multiplication/division operations, vector operations, address operations, or fast Fourier transform (FFT) operations may be performed. Also, a function of a mathematical function for execution used for inference may be performed within the DRAMs 2500*a* and 2500*b*. Here, the inference may be performed in a deep learning algorithm that uses an artificial neural network. The deep learning algorithm may include a training step of learning a model through various data and an inference step of recognizing data with the learned model. As an example, an image taken by a user through the camera 2100 may be signal processed and stored in the DRAM 2500*b*, and the accelerator block or accelerator chip 2820 may perform AI data operations of recognizing data using the data stored in the DRAM 2500*b* and the mathematical function used for inference.

The system 2000 may include a plurality of storages or the plurality of flash memories 2600*a* and 2600*b* having larger capacities than the DRAMs 2500*a* and 2500*b*. The accelerator block or accelerator chip 2820 may perform a training step and an AI data operation, using the flash memories 2600*a* and 2600*b*. In an embodiment, the flash memories 2600*a* and 2600*b* may include a memory controller 2610 and a flash memory device 2620, and may perform more efficiently the training step and the inference AI data operation performed by the AP 2800 and/or the accelerator chip 2820, using a computing device installed in the memory controller 2610. The flash memories 2600*a* and 2600*b* may store photos taken through the camera 2100, or store data received over a data network. For example, the flash memories 2600*a* and 2600*b* may store augmented reality/virtual reality, high definition (HD), or ultra high definition (UHD) content.

In the system 2000, the flash memories 2600*a* and 2600*b* may include the memory devices described with reference to FIGS. 1 through 15. The memory devices may include a memory cell array including a plurality of cell strings in which a plurality of memory cells are coupled in series between a string select transistor and a ground select transistor, a voltage generator configured to generate a precharge voltage, a program voltage, and a negative voltage, and a control logic circuit configured to control a program operation so that a threshold voltage of a selected memory cell of selected cell strings among the plurality of cell strings has a target state. The precharge voltage may be set to have a voltage level higher than a ground voltage, and the negative voltage may be set to have a voltage level lower than the ground voltage. The program operation may be performed by program loops, based on a voltage increment of the program voltage, and each of the program loops may include a precharge duration and a program execution duration. The control logic circuit may provide the precharge voltage during the precharge duration and the negative voltage during the program execution duration, to each of the string select transistor and the ground select transistor of unselected cell strings among the plurality of cell strings. The memory device may maximize a self-boosting effect by precharging a channel of a program-inhibited cell string among the plurality of cell strings at a bit line and common source line side to become a floating node, and may prevent a leakage of electrons from a bit line and a common source line by the negative voltage applied to an unselected string select line and a ground select line. Accordingly, program disturbance may be suppressed.

Although embodiments have been described above using specific terminology, this terminology is not used to limit the meaning or scope of the disclosure. Therefore, those skilled in the art will understand that various modifications and other equivalent embodiments are included in the scope of the disclosure.

While embodiments are particularly shown in the drawings and described above, it will be understood that various changes in form and details may be made therein without departing from the spirit and scope of the following claims.

What is claimed is:

1. A memory device comprising:

a memory cell array comprising a plurality of cell strings, wherein each cell string comprises a plurality of memory cells which are coupled in series between a string select transistor and a ground select transistor;

a voltage generator configured to generate a precharge voltage, a program voltage, and a negative voltage, wherein a voltage level of the precharge voltage is higher than a voltage level of a ground voltage, and a voltage level of the negative voltage is lower than the voltage level of the ground voltage; and a control logic circuit configured to control a program operation for programming a threshold voltage of a selected memory cell of a selected cell string from among the plurality of cell strings to have a target state, wherein the program operation is performed using a plurality of program loops, based on a voltage increment of the program voltage, and wherein each program loop from among the plurality of program loops comprises a precharge duration and a program execution duration, wherein the control logic circuit is further configured to provide the negative voltage to a plurality of unselected string select transistors and a plurality of unselected ground select transistors included in a plurality of unselected cell strings from among the plurality of cell strings, during the program execution duration, wherein the control logic circuit is further configured to provide the precharge voltage to a common source line coupled to a plurality of ground select transistors included in the plurality of cell strings, during at least one of the precharge duration and the program execution duration, and wherein the control logic circuit is further configured to provide the precharge voltage to a selected bit line coupled to the selected cell string during the precharge duration.

2. The memory device of claim 1, wherein the control logic circuit is further configured to provide the precharge voltage to the plurality of unselected string select transistors and the plurality of unselected ground select transistors.

3. The memory device of claim 2, wherein the control logic circuit is further configured to provide the precharge voltage to the common source line coupled to the plurality of ground select transistors included in the plurality of cell strings, during the precharge duration and the program execution duration.

4. The memory device of claim 3, wherein the control logic circuit is further configured to provide the ground voltage to the selected bit line during the program execution duration.

5. The memory device of claim 4, wherein the control logic circuit is further configured to provide a bit line voltage to a plurality of unselected bit lines coupled to the plurality of unselected cell strings, and provide an activation voltage to a selected string select transistor, during the precharge duration and the program execution duration.

6. The memory device of claim 5, wherein the control logic circuit is further configured to provide a self-boosting effect by allowing the plurality of unselected cell strings to become floating nodes.

7. The memory device of claim 1, wherein the control logic circuit is further configured to provide the ground voltage to a selected word line coupled to the selected memory cell and to a plurality of unselected word lines coupled to a plurality of unselected memory cells, during the precharge duration.

8. The memory device of claim 7, wherein the control logic circuit is further configured to provide the program voltage to the selected word line and to provide a pass voltage to the plurality of unselected word lines, during the program execution duration, and wherein a voltage level of the pass voltage is configured to activate the plurality of memory cells regardless of program states of the plurality of memory cells, and wherein the pass voltage is generated by the voltage generator.

9. The memory device of claim 1, wherein the control logic circuit is further configured to program first data, second data, and third data according to a two-step programming process, during the program operation, wherein the two-step programming process comprises a first step program in which memory cells having threshold voltages included in a first threshold voltage distribution corresponding to an erase state are programmed to have threshold voltages included in a second threshold voltage distribution corresponding to a first program state, according to the first data, and wherein the two-step programming process further comprises a second step program in which the memory cells having threshold voltages included in the first threshold voltage distribution are programmed to have threshold voltages included in one from among a third threshold voltage distribution corresponding to a second program state, a fourth threshold voltage distribution corresponding to a third program state, and a fifth threshold voltage distribution corresponding to a fourth program state according to the second data and the third data, and memory cells including threshold voltages included the second threshold voltage distribution are programmed to have threshold voltages included in one from among a sixth threshold voltage distribution corresponding to a fifth program state, a seventh threshold voltage distribution corresponding to a sixth program state, an eighth threshold voltage distribution corresponding to a seventh program state, and a ninth threshold voltage distribution corresponding to an eighth program state according to the second data and the third data.

10. The memory device of claim 1, further comprising:

a first chip comprising a peripheral circuit region comprising the control logic circuit, wherein the peripheral circuit region is on a first surface of a first substrate of the first chip; and a second chip comprising three-dimensional arrays comprising the plurality of memory cells of the memory cell array, wherein the three-dimensional arrays are on a first surface of a second substrate of the second chip, and wherein the second chip is vertically stacked on the first chip, and the first surface of the first substrate of the first chip is bonded to the first surface of the second substrate of the second chip.

11. A programming method for programming a memory device including a plurality of cell strings, each of which includes a plurality of memory cells are coupled in series between a string select transistor and a ground select transistor, the method comprising:

generating a precharge voltage, a program voltage, a pass voltage, and a negative voltage, wherein a voltage level of the precharge voltage is higher than voltage level of a ground voltage, and a voltage level of the negative voltage is lower than a voltage level of the ground voltage, and wherein a voltage level of the pass voltage is set to a voltage level configured to active the plurality of memory cells regardless of program states of the plurality of memory cells;

performing a program operation for programming a threshold voltage of a selected memory cell of a selected cell string from among the plurality of cell strings to have a target state, wherein the program operation is performed using a plurality of program loops, based on a voltage increment of the program voltage, and wherein each program loop of the plurality of program loops comprises a precharge duration and a program execution duration;

providing the precharge voltage to a plurality of unselected string select transistors and a plurality of unselected ground select transistors included in a plurality of unselected cell strings from among the plurality of cell strings, during the precharge duration;

providing the negative voltage to the plurality of unselected string select transistors and the plurality of unselected ground select transistors, during the program execution duration;

providing the precharge voltage to a common source line coupled to a plurality of ground select transistors included in the plurality of cell strings, during at least one of the precharge duration and the program execution duration; and providing the precharge voltage to a selected bit line coupled to the selected cell string during the precharge duration.

12. The method of claim 11, further comprising:

providing the precharge voltage to the common source line coupled to the plurality of ground select transistors included in the plurality of cell strings during the precharge duration and the program execution duration.

13. The method of claim 11, further comprising:

providing the ground voltage to the selected bit line during the program execution duration.

14. The method of claim 11, further comprising:

providing a bit line voltage to a plurality of unselected bit lines coupled to the plurality of unselected cell strings, during the precharge duration and the program execution duration; and providing an activation voltage to a selected string select transistor, during the precharge duration and the program execution duration.

15. The method of claim 11, further comprising:

providing the ground voltage to a selected word line coupled to the selected memory cell and to a plurality of unselected word lines coupled to a plurality of unselected memory cells, during the precharge duration;

providing the program voltage to the selected word line, during the program execution duration; and providing the pass voltage to the plurality of unselected word lines, during the program execution duration.

16. The method of claim 11, wherein the performing the program operation comprises programming first data to third data according to a two-step programming process, and wherein the method further comprises:

programming, by a first step program, memory cells belonging to a threshold voltage distribution corresponding to an erase state to have threshold voltages belonging to threshold voltage distributions corresponding to a first program state according to the first data to be programmed;

programming, by a second step program, the memory cells belonging to the threshold voltage distribution corresponding to the erase state to have threshold voltages belonging to threshold voltage distributions corresponding respectively to a second program state to a fourth program state according to the second data and third data to be programmed; and programming, by the second step program, memory cells belonging to the threshold voltage distribution corresponding to the first program state to have threshold voltages belonging to threshold voltage distributions corresponding respectively to a fifth program state to an eighth program state according to the second data and third data to be programmed.

17. A programming method of a memory device including a plurality of cell strings, each of which includes a plurality of memory cells are coupled in series between a string select transistor and a ground select transistor, the method comprising:

generating a precharge voltage, a program voltage, and a negative voltage, wherein a voltage level of the precharge voltage is higher than a voltage level of a ground voltage, and a voltage level of the negative voltage is lower than the voltage level of the ground voltage;

performing a program operation for programming a threshold voltage of a selected memory cell of a selected cell string from among the plurality of cell strings to have a target state, wherein the program operation is performed using a plurality of program loops, based on a voltage increment of the program voltage, and wherein each program loop of the plurality of program loops comprises a precharge duration and a program execution duration;

providing the ground voltage to a plurality of unselected string select transistors and a plurality of unselected ground select transistors included in a plurality of unselected cell strings from among the plurality of cell strings, during the precharge duration;

providing the negative voltage to the plurality of unselected string select transistors and the plurality of unselected ground select transistors, during the program execution duration; and providing the ground voltage to a common source line coupled to a plurality of ground select transistors included in the plurality of cell strings, during the precharge duration and the program execution duration.

18. The method of claim 17, further comprising:

providing the ground voltage to a bit line coupled to the selected cell string during the precharge duration and the program execution duration;

providing a bit line voltage to a plurality of unselected bit lines coupled to the plurality of unselected cell strings, during the precharge duration and the program execution duration; and providing an activation voltage to a selected string select transistor, during the precharge duration and the program execution duration.

19. The method of claim 17, further comprising:

providing the ground voltage to a selected word line coupled to the selected memory cell and a plurality of unselected word lines coupled to a plurality of unselected memory cells, during the precharge duration;

providing the program voltage to the selected word line, during the program execution duration; and providing a pass voltage to the plurality of unselected word lines, during the program execution duration.

* * * * *